(12) United States Patent
Iwakuma et al.

(10) Patent No.: US 8,895,154 B2
(45) Date of Patent: Nov. 25, 2014

(54) ORGANIC ELECTROLUMINESCENT DEVICE

(75) Inventors: Toshihiro Iwakuma, Sodegaura (JP); Hiroya Yasuda, Sodegaura (JP); Kiyoshi Ikeda, Sodegaura (JP); Keiko Yamamichi, Sodegaura (JP); Takashi Arakane, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 828 days.

(21) Appl. No.: 10/588,773

(22) PCT Filed: Mar. 1, 2005

(86) PCT No.: PCT/JP2005/003384
§ 371 (c)(1),
(2), (4) Date: Aug. 8, 2006

(87) PCT Pub. No.: WO2005/084083
PCT Pub. Date: Sep. 9, 2005

(65) Prior Publication Data
US 2007/0172698 A1    Jul. 26, 2007

(30) Foreign Application Priority Data

Mar. 2, 2004 (JP) ................................. 2004-057048

(51) Int. Cl.
*H01L 51/54* (2006.01)
*H01L 51/56* (2006.01)
*C09K 11/06* (2006.01)
*H05B 33/14* (2006.01)
*H01L 51/50* (2006.01)
*H05B 33/22* (2006.01)

(52) U.S. Cl.
CPC ................ *C09K 11/06* (2013.01); *H05B 33/14* (2013.01); *C09K 2211/1044* (2013.01); *C09K 2211/1037* (2013.01); *C09K 2211/1029* (2013.01); *H01L 51/5016* (2013.01); *C09K 2211/185* (2013.01); *C09K 2211/1059* (2013.01); *H05B 33/22* (2013.01); *Y10S 428/917* (2013.01)
USPC ........ 428/690; 428/917; 428/411.1; 428/336; 548/101

(58) Field of Classification Search
USPC .............................................. 257/40; 428/690
See application file for complete search history.

(56) References Cited

U.S. PATENT DOCUMENTS 6,479,172 B2 * 11/2002 Hu et al. ........................ 428/690
6,617,051 B1 * 9/2003 Higashi et al. ................ 428/690

(Continued)

FOREIGN PATENT DOCUMENTS

EP    1 063 869 A1    12/2000
EP    1 311 138 A1    5/2003

(Continued)

OTHER PUBLICATIONS

Douglas Skoog and Donald West, Principles of INstrumental Analysis, 1980 second edition, pp. 110-111.*

(Continued)

*Primary Examiner* — J. L. Yang
(74) *Attorney, Agent, or Firm* — Oblon, Spivak, McClelland, Maier & Neustadt, L.L.P.

(57) ABSTRACT

Provided is an organic electroluminescent device in which an organic thin film layer comprising a single layer or plural layers comprising a phosphorescence light-emitting layer containing at least a host material and a phosphorescent organic metal complex is interposed between a cathode and an anode, wherein the total of the halogen element mass concentrations of bromine, iodine and chlorine which are contained as impurities in the host material constituting the light-emitting layer described above is 50 ppm or less. It has a high emission luminance, a high luminous efficiency and a long life.

17 Claims, 4 Drawing Sheets

(56) References Cited

U.S. PATENT DOCUMENTS

| | | | |
|---|---|---|---|
| 2002/0125818 A1 | 9/2002 | Sato et al. | |
| 2003/0157366 A1 | 8/2003 | Matsuura et al. | |
| 2004/0007971 A1 | 1/2004 | Higashi et al. | |
| 2004/0086745 A1* | 5/2004 | Iwakuma et al. | 428/690 |
| 2005/0095453 A1* | 5/2005 | Begley et al. | 428/690 |
| 2006/0035109 A1 | 2/2006 | Arakane et al. | |

FOREIGN PATENT DOCUMENTS

| | | | | |
|---|---|---|---|---|
| EP | 1 422 203 A1 | 5/2004 | | |
| JP | 8-325565 A | 12/1996 | | |
| JP | 10-265774 A | 10/1998 | | |
| JP | 2001-250678 A | 9/2001 | | |
| JP | 2002 175885 | 6/2002 | | |
| JP | 2002-371023 A | 12/2002 | | |
| JP | 2002 373785 | 12/2002 | | |
| JP | 2002-373785 A | 12/2002 | | |
| JP | 2002-373786 | 12/2002 | | |
| JP | 2003-221484 | 8/2003 | | |
| JP | 2003-253129 A | 9/2003 | | |
| JP | 2003-317946 | 11/2003 | | |
| JP | 2003-347624 A | 12/2003 | | |
| JP | 2004031004 A | * 1/2004 | | H05B 33/14 |
| JP | 2004 311415 | 11/2004 | | |
| JP | 2005-222794 A | 8/2005 | | |
| WO | WO 00/41443 A1 | 7/2000 | | |

OTHER PUBLICATIONS

Machine English translation of JP 2004-031004 A. Mar. 31, 2014.*
U.S. Appl. No. 11/480,465, filed Jul. 5, 2006, Iwakuma, et al.
U.S. Appl. No. 11/480,463, filed Jul. 5, 2006, Iwakuma, et al.
U.S. Appl. No. 10/567,903, filed Feb. 10, 2006, Iwakuma, et al.
U.S. Appl. No. 10/574,179, filed Mar. 30, 2006, Iwakuma, et al.
U.S. Appl. No. 10/575,092, filed Apr. 7, 2006, Arakane, et al.
U.S. Appl. No. 10/588,233, filed Aug. 3, 2006, Matsuura, et al.
U.S. Appl. No. 10/588,786, filed Aug. 9, 2006, Matsuura, et al.
U.S. Appl. No. 10/588,549, filed Aug. 7, 2006, Matsuura, et al.
U.S. Appl. No. 11/498,071, filed Aug. 3, 2006, Matsuura, et al.
U.S. Appl. No. 11/512,110, filed Aug. 30, 2006, Matsuura, et al.
U.S. Appl. No. 11/480,919, filed Jul. 6, 2006, Matsuura, et al.
Xiaodong Bu, et al., "Determination of Halogens in Organic Compounds by High Resolution Inductively Coupled Plasma Mass Spectrometry (HR-ICP-MS)", Journal of Analytical Atomic Spectrometry, XP 002519885, vol. 18, Nov. 13, 2003, pp. 1443-1451.
U.S. Appl. No. 12/755,240, filed Apr. 6, 2010, Iwakuma, et al.
U.S. Appl. No. 13/142,091, filed Jun. 24, 2011, Iwakuma, et al.
Office Action issued Nov. 28, 2011 in Taiwanese Patent Application No. 094106321.
Japanese Office Action Issued Apr. 2, 2013 in Patent Application No. 2011-148564.
Notice of Opposition issued Sep. 6, 2013 in European Patent Application No. 05719701.4.
Stephen J. Blanksby, et al., "Bond Dissociation Energies of Organic Molecules", Accounts of Chemical Research, vol. 36, No. 4, 2003, pp. 255-263.
Hideo Hayashi, et al., "Determination of halogens by low-pressure helium ICP-MS", Bunseki Kagaku, vol. 52, No. 4, 2003, pp. 275-278 with English abstract and English translation.
Office Action issued on Feb. 4, 2014 in the corresponding Japanese Patent Application No. JP2011-148564.

* cited by examiner

ORGANIC ELECTROLUMINESCENT DEVICE

CROSS-REFERENCE TO RELATED APPLICATIONS

The present application is a 35 U.S.C. §371 National Stage patent application of International patent application PCT/JP05/003384, filed on Mar. 1, 2005, which claims priority to Japanese patent application JP 2004-057048, filed on Mar. 2, 2004.

BACKGROUND OF THE INVENTION

The present invention relates to an organic electroluminescent device comprising a phosphorescent organic thin film layer and a material for an organic electroluminescent device, specifically to an organic electroluminescent device having a high emission luminance and a high luminous efficiency and having a long life, a material for an organic electroluminescent device, a luminescent organic metal complex and a host material for an organic electroluminescent device.

RELATED ART

An organic electroluminescent device (hereinafter "electroluminescent" shall be abbreviated as EL) is a spontaneous luminescent device making use of the principle that a fluorescent substance emits light by recombination energy of holes injected from an anode and electrons injected from a cathode by applying an electric field. Since a low voltage-driven organic EL device of a laminate type was reported by C. W. Tang of Eastman Kodak Company (C. W. Tang and S. A. Vanslyke, Applied Physics Letters, Vol. 51, p. 913, 1987), researches on organic EL devices comprising organic materials as structural materials have actively been carried out. Tang et al. use tris(8-hydroxyquinolinolaluminum) for the light-emitting layer and a triphenyldiamine derivative for the hole transporting layer. The advantages of a laminate structure include an elevation in an efficiency of injecting holes into a light-emitting layer, a rise in a forming efficiency of excitons formed by blocking electrons injected from a cathode to recombine them and shutting up of excitons formed in the light-emitting layer. As shown in the above example, a two layer type comprising a hole transporting (injecting) layer and an electron transporting light-emitting layer and a three layer type comprising a hole transporting (injecting) layer, a light-emitting layer and an electron transporting (injecting) layer are well known as the device structures of the organic EL device. In such laminate type structural devices, device structures and forming methods are studied in order to enhance a recombination efficiency of holes and electrons injected.

Known as luminescent materials for an organic EL device are luminescent materials such as chelate complexes including a tris(8-quinolinolate)aluminum complex, coumarin derivatives, tetraphenylbutadiene derivatives, bisstyrylarylene derivatives and oxadiazole derivatives. It is reported that luminescence of a blue color to a red color in a visible region is obtained from them, and it is expected that a color display device is materialized (for example, a patent document 1 and a patent document 2).

In recent years, it is proposed as well to make use of an organic phosphorescent material in addition to a luminescent material for a light-emitting layer in an organic EL device (refer to, for example, a non-patent document 1 and a non-patent document 2).

As described above, a high luminous efficiency is achieved by making use of a singlet state and a triplet state in an excited state of an organic phosphorescent material in a light-emitting layer of an organic EL device. It is considered that a singlet exciton and a triplet exciton are produced in a proportion of 1:3 due to a difference in a spin multiplicity when an electron and a hole are recombined in an organic EL device, and therefore it is considered that a luminous efficiency which is larger by 3 to 4 times than that of a device using only fluorescence is achieved if a phosphorescence light-emitting material is used.

In such organic EL device, there has been used a constitution in which layers are laminated in such an order as an anode, a hole transporting layer, an organic light-emitting layer, an electron transporting layer (hole blocking layer), an electron injecting layer and a cathode so that a triplet excited state or a triplet exciton is not quenched, and a host compound and a phosphorescent material have been used for an organic light-emitting layer.

Further, the above organic EL device is to establish a technique for inhibiting a decay in a light-emitting luminance of the organic EL device which is accompanied with operation thereof over a long period of time and making it durable in terms of actual use. In respect to the above problem, it is described that a purity of various organic compounds used for the constitutional materials of the organic EL device exerts effects strongly on a luminous efficiency and a decay in a luminescence intensity (refer to, for example, a non-patent document 3 and a non-patent document 4). However, not only effects exerted on the performances of the organic EL device by the structures and the properties of the compounds have not been clearly shown, but also a method for making it quantitatively clear has not yet been established.

In an organic EL device containing no phosphorescence light-emitting material, a quantitative allowable range of impurities in a practical device has been shown for the first time, and it is described in the examples that an allowable range thereof is up to 500 pm (patent document 3). However, a case containing a phosphorescent material is not described in the patent document 3, and a quantitative effect of impurities in a practical phosphorescent organic EL device has never been referred to and is uncertain. In a patent document 4, a concentration of impurities is quantitatively determined by high performance liquid chromatography (HPLC) analysis. However, the resolution is deteriorated when a concentration of the impurities is low, and accurate quantitative determination is limited. Accordingly, desired is an organic EL device in which impurities are quantitatively determined by higher sensitive analysis and in which the impurities are further reduced.

Further, a light emitting device comprising an organic compound layer in which a content of impurities is 1.0 mass % or less (corresponding to almost 10000 ppm) or less to 0.1 mass % or less (corresponding to almost 1000 ppm or less) is proposed in the patent document 4. It is confirmed by high performance liquid chromatography (HPLC) that materials used for the above device have a purity of 99.9% or more, but it is shown that limitation in detection of an impurity concentration is 0.1 mass % (1000 ppm). The impurities are preferably decomposition products originating in the organic compounds constituting the organic compound layer. α-NPD in which a purity is confirmed to be 99.9% or more by high performance liquid chromatography (HPLC) is used after thermally decomposed in the examples, and nothing is referred to as far as an effect of a halogen content is concerned.

A light emitting device comprising an organic compound layer in which a content of impurities capable of being produced by cross coupling reaction is 0.5 mass % or less (corresponding to almost 5000 ppm or less) to 0.1 mass % or less (corresponding to almost 1000 ppm or less) is proposed in a patent document 5. However, compounds obtained by substituting halogen atoms and metal atoms contained in raw materials used for the reaction with hydrogens are assumed as the impurities, and an impurity is biphenyl even when refined α-NPD in which impurities are not detected by high performance liquid chromatography (detection limit is 0.05%). An effect of halides is not referred to.

A luminescent polymer composition in which a phosphorescent agent is contained in a polymer component is proposed in a patent document 6, and it is described that an impurity concentration in a dimer thereof contained is preferably 1000 ppm or less in a phosphorescent iridium complex compound which is the phosphorescent agent. Used in the examples is a coating liquid for forming a light-emitting layer prepared by mixing a polymer with an iridium complex compound in which a concentration of a dimer containing a chlorine atom is 100 ppm or less. However, it is not described therein that a halogen concentration exerts an effect directly on the device performances, and it is not described as well that it was detected by using a method for detecting directly halogens. Further, the whole mass concentration of halogens contained in materials containing free halogens is not analyzed, and therefore an amount of halogens contained in the iridium complex is not measured, so that a true chlorine concentration is uncertain. Further, an amount of impurities contained in a polymer used is not described.

In the case of a phosphorescent organic electroluminescent device, a high luminous efficiency is expected, and therefore deterioration caused by applying an electric current is a serious problem. As described from a long time ago, halogen compounds act as a quenching factor in many cases also in a fluorescent organic electroluminescent device. In a phosphorescent device, an emission lifetime is as relatively long as a microsecond order, and a proportion in which an exciton is diffused in a light-emitting layer is large as compared with a fluorescent type device. Accordingly, even if a small amount of halogen impurities is present, a probability in which the impurities meet with the exciton is raised as compared with that of the fluorescent type device, and therefore it is considered that contribution of being quenched more is large as compared with that of the fluorescent type device in which an emission lifetime is quick in a nanosecond order. Accordingly, a mass concentration of halogens has to be reduced furthermore in the phosphorescent device as compared with that of the fluorescent device.

Patent document 1: Japanese Patent Application Laid-Open No. 239655/1996
Patent document 2: Patent Application Laid-Open No. 138561/1995
Patent document 3: Patent No. 3290432
Patent document 4: Japanese Patent Application Laid-Open No. 373785/2002
Patent document 5: Japanese Patent Application Laid-Open No. 373786/2002
Patent document 6: Japanese Patent Application Laid-Open No. 221484/2003
Non-patent document 1: D. F. O'Brien and M. A. Baldo et al "Improved energy transferring electrophosphrescent devices", Applied Physics Letters, Vol. 74, NO. 3, pp. 442 to 444, Jan. 18, 1999
Non-patent document 2: M. A. Baldo et al "Very high-efficiency green organic light-emitting devices based on electrophosphrescence", Applied Physics Letters, Vol. 75, No. 1, pp. 4 to 6, Jul. 5, 1999
Non-patent document 3: monthly "Display" September issue, pp. 15 (1995)
Non-patent document 4: "Applied Physics" vol. 66, No. 2, pp. 114 (1997)

DISCLOSURE OF THE INVENTION

The present invention has been made in order to solve the problems described above, and an object thereof is to provide an organic EL device having a high emission luminance and a high luminous efficiency and having a long life, a material for an organic EL device, a phosphorescent organic metal complex and a host material for an organic EL device.

Intensive researches repeated by the present inventors in order to achieve the object described above have resulted in identifying impurities of halogen elements exerting an adverse effect on an emission luminance, a luminous efficiency and a life in a phosphorescent organic EL device, and quantitative analysis thereof at a high sensitivity by means of inductively coupled plasma-mass spectrometry (ICP-MS analysis) have resulted in finding that an effect exerted on a luminous performance by an upper value of a halogen element concentration is severer than in a fluorescent type organic EL device. Further, preparation and evaluation of a phosphorescent organic EL device in which a concentration of halogen elements as impurities in a material for an organic EL device contained in an organic thin film layer is reduced very much have resulted in finding that an emission luminance, a luminous efficiency and a half-reduced life are improved. In particular, they have succeeded in enhancing the emission luminance and the half-reduced life and have come to complete the present invention.

That is, the present invention provides: an organic EL device in which an organic thin film layer comprising a single layer or plural layers comprising a phosphorescence light-emitting layer containing at least a host material and a phosphorescent organic metal complex is interposed between a cathode and an anode, wherein the total of halogen element mass concentrations of bromine, iodine and chlorine which are contained as impurities in the host material constituting the light-emitting layer described above is 50 ppm or less, an organic EL device in which an organic thin film layer comprising a single layer or plural layers comprising a phosphorescence light-emitting layer containing at least a host material and a phosphorescent organic metal complex is interposed between a cathode and an anode, wherein the total of halogen element mass concentrations of bromine and iodine which are contained as impurities in the host material constituting the light-emitting layer described above is 40 ppm or less, an organic EL device in which an organic thin film layer comprising a single layer or plural layers comprising a phosphorescence light-emitting layer containing at least a host material and a phosphorescent organic metal complex is interposed between a cathode and an anode, wherein a halogen element mass concentration of bromine which is contained as an impurity in the host material constituting the light-emitting layer described above is 30 ppm or less, a material for an organic EL device in which the halogen element mass concentrations of bromine, iodine and chlorine as impurities are identified respectively by inductively coupled plasma-mass spectrometry (ICP-MS analysis) or a coulometric titration method, a phosphorescent organic metal complex in which a total amount of halogen element concentrations of bromine, iodine and chlorine as impurities which are identified by ICP-MS analysis or a coulometric titration method is 1 ppb to 5 ppm, a host material for an organic EL device in which a total amount of halogen element concentrations of bromine, iodine and chlorine as impurities which are identified by ICP-MS analysis or a coulometric titration method is 1 ppb to 5 ppm and an organic EL device in which an organic thin film layer comprising a single layer or plural layers comprising a phosphorescence light-emitting layer containing at least a host material and a phosphorescent organic metal complex is interposed between a cathode and an anode, wherein the light-emitting layer described above is formed by using the phosphorescent organic metal complex described above and the host material described above.

The organic EL device of the present invention having a high emission luminance and a high luminous efficiency and having a long life can be provided by reducing very much a mass concentration of halogen elements as impurities contained in a light-emitting layer.

BRIEF DESCRIPTIONS OF THE DRAWINGS

BEST MODE FOR CARRYING OUT THE INVENTION

Figure 1:
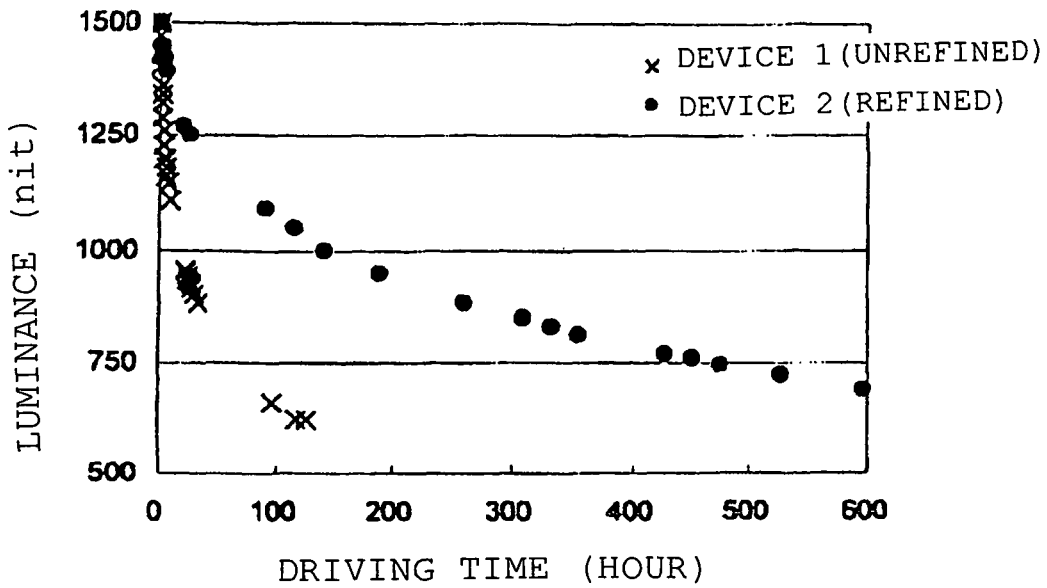
FIG. 1 is a drawing showing a change in an emission luminance versus a driving time when driving the organic electroluminescent devices prepared in Example 1 and Comparative Example 1 at a low voltage.

The organic EL device of the present invention is an organic EL device in which an organic thin film layer comprising a single layer or plural layers comprising a phosphorescence light-emitting layer containing at least a host material and a phosphorescent organic metal complex is interposed between a cathode and an anode, wherein the total of halogen element concentrations of bromine, iodine and chlorine which are contained as impurities in the host material constituting the light-emitting layer described above is 50 ppm or less, preferably 40 ppm or less and more preferably 5 ppm or less.

In the organic EL device of the present invention, the total of halogen element mass concentrations of bromine and iodine which are contained as impurities in the host material constituting the light-emitting layer described above is 40 ppm or less, preferably 30 ppm or less and more preferably 5 ppm or less.

Further, in the organic EL device of the present invention, a halogen element mass concentration of bromine which is contained as an impurity in the host material constituting the light-emitting layer described above is 30 ppm or less, preferably 5 ppm or less.

In the respective organic EL devices described above, a lower limit of the total of the halogen element mass concentrations described above is preferably 1 ppb.

In the material for an organic EL device used in the present invention, the halogen element mass concentrations of bromine, iodine and chlorine are preferably identified respectively by inductively coupled plasma-mass spectrometry (ICP-MS analysis) or a coulometric titration method. The total amount of the halogen element mass concentrations described above is preferably 1 ppb to 5 ppm, and a halogen element mass concentration of bromine as an impurity is preferably 30 ppm or less.

In the phosphorescent organic metal complex used in the present invention, the total amount of the halogen element mass concentrations of bromine, iodine and chlorine as impurities which are identified by ICP-MS analysis or a coulometric titration method which shall be explained below is preferably 1 ppb to 5 ppm.

In the host material for an organic EL device used in the present invention, the total amount of the halogen element mass concentrations of bromine, iodine and chlorine as impurities which are identified by the ICP-MS analysis or the coulometric titration method is preferably 1 ppb to 5 ppm.

In the organic EL device of the present invention, the light-emitting layer described above is preferably formed by using the phosphorescent organic metal complex of the present invention and the host material of the present invention.

The examples of the halogen atoms described above include fluorine, chlorine, bromine and iodine, and it is known that since halogen atoms have a very small fluorescence quantum yield and show a quenching action, a decay in an emission luminance of the organic EL device and a reduction in an emission lifetime thereof are brought about. In the present invention, however, it has been found that it is preferred to reduce very much the halogen atoms as impurities to the ranges described above. In particular, it is preferred to reduce very much the contents of bromine, chlorine and iodine which are halogen elements contained in compounds used in synthesizing to the ranges described above.

Further, a halogen element mass concentration of at least one halide contained in a material constituting a hole transporting layer, an electron transporting layer or a hole blocking layer which is adjacent to the light-emitting layer is preferably 20 ppm or less, more preferably 1 ppb to 20 ppm and particularly preferably 1 ppb to 10 ppm. A halogen element mass concentration of at least one halide contained in the phosphorescent organic metal complex in the light-emitting layer is preferably 20 ppm or less, more preferably 1 ppb to 20 ppm and particularly preferably 1 ppb to 10 ppm.

Quantitative analysis of halogen elements includes methods in which elemental analysis, gas chromatography analysis, HPLC analysis and mass spectroscopy are carried out, and elemental analysis is low in a sensitivity and has a large fluctuation in a value for quantitative determination. Accordingly, it is not preferred. Gas chromatography is an effective analytical means for a low molecular compound having a high volatility, but it is not preferred for a high boiling. compound. In respect to HPLC analysis, halogen ions can be analyzed by ion chromatography, and halogen elements in which retention time has become clear in advance each can be quantitatively analyzed. However, quantitative analysis of impurities by HPLC is limited to concentration analysis of about 100 ppm, and it is limited (up to purity 99.9X %) to the second decimal place in terms of % purity.

One of apparatuses which solve the problem of detection limit includes an inductively coupled plasma-mass spectrometric (ICP-MS) apparatus. Ultratrace elemental analysis of ppb and ppt levels having a very high sensitivity becomes possible by using an inductively coupled plasma (ICP: discharge plasma generated by giving high-frequency energy to argon gas of atmospheric pressure) as an ionizing source and combining a mass spectrometric apparatus as a detecting part. Almost all elements can be analyzed, and halogen elements can be analyzed as well on a ppt level. The apparatus is composed mainly of an [ionizing part], a [mass spectrometric part] and a [detection·data processing part], and in the [ionizing part], a sample solution is introduced into argon plasma of several 1000° C. to ionize elements to be analyzed. Ions produced are introduced into the [mass spectrometric part] under vacuum environment and separated by every mass of the respective ions by means of a mass spectrometer. The kind of the mass spectrometer includes a quadrupole type mass spectrometer and a magnetic field type mass spectrometer (double-focusing type). A quadruple-focusing type is easy in operation and can scan a wide mass rage at a high speed. A high resolution can be obtained in the double-focusing type, and an effect of a [molecular ion] can be removed, so that it has a higher sensitivity by one digit or more than that of the quadruple-focusing type. Either analytical apparatus can be used for analysis of a ppb to ppm level, and therefore the quadruple-focusing type which is common and easy to operate is preferred.

In the inductively coupled plasma-mass spectrometry, however, argon of plasma, oxygen contained in purified water, hydrogen, nitrogen contained in the air and molecular ions originating in carbon are detected as a background. In particular, in the case of chlorine and fluorine, large amounts of chemical species having the same masses are contained in the background, and therefore quantitative trace amount analysis is difficult. The examples of the chemical species having the same masses include, for example, $^{18}OH$, $^{17}OH_2$ and $^{16}OH_3$ in $^{19}F$ and $^{17}O^{18}O$, $^{16}O^{18}OH$ and $^{17}O^{17}H$ in $^{35}Cl$. Accordingly, another analytical method is preferred for investigating effects of chlorine compounds used as synthetic intermediates for the materials and raw materials for synthesizing the materials. One example thereof includes a coulometric titration method. This is a method in which a sample put on a quartz cell is gradually burned in argon flow and then completely burned in oxygen flow and in which HCl gas produced is introduced into a titration cell passing through a dehydrating bath to titrate a chlorine amount. HCl gas is reacted with an Ag ion in the titration cell to produce AgCl. In this case, if a potential of an electrolyte in the titration cell which is maintained at a fixed level is changed, an electrolytic current is allowed to flow to a generating electrode pair so that the potential is returned to an end-point potential, and a silver ion (Ag+) is generated from a silver-generating electrode, whereby a chlorine amount is titrated. A chlorine concentration in a sample can be measured up to several ppm by this analytical method.

In refining the organic compound materials (host materials) used for the organic EL device in the present invention, a sublimation refining method is an effective refining method particularly for sublimating organic compound materials. In general, sublimation refining is carried out by a method in which a sample to be sublimated and refined is put on a heating part; a tube prepared by glass which extends vertically or horizontally therefrom is set; the sample is sublimated by heating; and the sample sublimated is condensed in the glass tube set. However, if the sample sublimated is condensed at a strike in a part having too low temperature, impurities having a low molecular weight and highly sublimating impurities each contained in the sample are condensed together to reduce the refining purity.

Control of temperature in the heating part, control of temperature in the condensing part and control of temperature in a part apart from the condensing part to an opposite part of the heating part are important as means for solving the above problem. The preferred method includes a method in which the heating part is maintained at a little lower temperature than temperature at which a pure sample is sublimated and in which low molecular components and highly sublimating components each contained as impurities are removed by sublimating in advance and a method in which the heating part is heated to temperature at which a pure sample is sublimated and a temperature of the condensing part is maintained at temperature which is a little lower than that of the heating part and at which the pure sample is condensed to thereby condense the sample having a good purity in the condensing part and in which more moderate temperature gradient than that of the heating part is set up at a side opposite to the heating part to condense impurities sublimated at lower temperature in a position apart from the condensing part for the pure sample as much as possible.

Usually, sublimation refining is carried out under reduced pressure, and a rise in a pressure-reducing degree makes it possible not only to lower a heating temperature for sublimation but also to prevent oxidative decomposition of organic compounds by heating caused by oxygen. When the pressure-reducing degree is low, formation of an oxygen adduct of the sample or oxidative cleavage thereof is brought about if sublimation refining is not carried out in inert gas flow, and the sample is decomposed in a certain case. Accordingly, the sample is preferably sublimated usually under environment in which an ambient pressure is 1 Pa or lower. It is more preferably $1 \times 10^{-2}$ Pa or lower.

In particular, a method in which temperature is accurately controlled, as described above, under reduced pressure to carry out sublimation refining is suited as a sublimation refining method of a material for an organic EL device.

Low molecular components and impurities having a high sublimating property include reagents used for synthesizing the sample, intermediate products in multistage synthesis, unreacted compounds including halides and residues of a catalyst used for the synthesis. Various impurities contained in the sample sublimated can be removed by the above method.

Particularly in an organic material taking part in phosphorescence, it is apparent that when an oxygen adduct (for example, a peroxo body) is present in the material, an adverse effect is exerted if oxygen which is a triplet quencher is discharged by any trigger in the device, and therefore sublimation refining is preferably carried out under environment in which oxygen is removed as much as possible. In this regard, sublimation refining carried out in inert gas (nitrogen or argon gas) can reduce an effect of oxygen addition, and therefore it can preferably be used.

In the organic EL device of the present invention, the organic thin film layer described above contains preferably at least one selected from phosphorescent organic metal complexes and at least one selected from aromatic hydrocarbon compounds and aromatic heterocyclic compounds, and the phosphorescence light-emitting layer contains more preferably the above compounds.

The aromatic hydrocarbon compound and the aromatic heterocyclic compound each described above have preferably a structure represented by the following Formula (1) or (2) respectively:

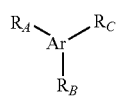
(1)

In Formula (1), Ar represents a substituted or non-substituted trivalent aromatic hydrocarbon group having 6 to 30 (preferably 6 to 18) ring carbon atoms or a substituted or non-substituted trivalent aromatic heterocyclic group having 3 to 20 (preferably 3 to 14) ring carbon atoms; $R_A$, $R_B$ and $R_C$ each represent independently a substituted or non-substituted aromatic hydrocarbon group having 6 to 30 (preferably 6 to 18) ring carbon atoms, a substituted or non-substituted aromatic heterocyclic group having 3 to 20 (preferably 3 to 14) ring carbon atoms or a substituted or non-substituted amino group; $R_A$, $R_B$ and $R_C$ each may be the same or different, and adjacent ones may be combined with each other.

In Formula (1), the aromatic hydrocarbon group represented by Ar includes, for example, trivalent residues of aromatic hydrocarbons such as benzene, naphthalene, anthracene, azulene, heptalene, indacene, acenaphthylene, fluorene, phenanthrene, fluoranthene, acenaphthylene, triphenylene, pyrene, chrysene, naphthacene, picene, pyrene and trinaphthylene.

In Formula (1), the aromatic heterocyclic group represented by Ar includes, for example, trivalent residues of aromatic heterocycles such as pyrroline, imidazoline, benzimidazoline, pyrazoline, isothiazole, isoxazole, pyridine, pyrazine, pyrimidine, pyridazine, triazine, thiophene, isobenzofuran, thianthrene, indolizine, imidazopyridine, isoindole, 3H-indolyl, indole, tetrahydrocarbazole, 1H-indazole, purine, isoquinoline, quinoline, phthalazine, naphthyridine, quinoxaline, quinazoline, cinnoline, pteridine, carbazole, carboline, phenanthridine, phenothiazine, phenoxazine, benzoisoquinoline, acridine, phenanthroline and phenazine.

In Formula (1), Ar is preferably benzenetriyl, pyridinetriyl, pyrimidinetriyl or triazinetriyl.

In Formula (1), the examples of the aromatic hydrocarbon group represented by $R_A$, $R_B$ and $R_C$ each include independently, in addition to the monovalent residues of the aromatic hydrocarbons explained in Ar described above, monovalent residues obtained by further combining the above residues with the aromatic hydrocarbon groups explained in Ar described above, 2-biphenyl, 3-biphenyl, 4-biphenyl and terphenyl.

In Formula (1), the examples of the aromatic heterocyclic group represented by $R_A$, $R_B$ and $R_C$ each include independently, in addition to the monovalent residues of the aromatic heterocycles explained in Ar described above, monovalent residues obtained by combining the aromatic hydrocarbon groups explained in Ar described above with the aromatic heterocyclic groups such as phenylpyridyl and phenylpyridinyl and monovalent residues obtained by combining two aromatic heterocyclic groups.

(2)

In Formula (2), Ar' represents a substituted or non-substituted divalent aromatic hydrocarbon group having 6 to 30 (preferably 6 to 18) ring carbon atoms or a substituted or non-substituted divalent aromatic heterocyclic group having 3 to 20 (preferably 3 to 14) ring carbon atoms; $R_A$ and $R_B$ each represent independently a substituted or non-substituted aromatic hydrocarbon group having 6 to 30 (preferably 6 to 18) ring carbon atoms, a substituted or non-substituted aromatic heterocyclic group having 3 to 20 (preferably 3 to 14) ring carbon atoms or a substituted or non-substituted amino group; and $R_A$ and $R_B$ each may be the same or different.

In Formula (2), the examples of the aromatic hydrocarbon group represented by Ar' each include independently the divalent residues of the aromatic hydrocarbons explained in Ar of Formula (1) described above.

In Formula (2), the examples of the aromatic heterocyclic group represented by Ar' each include independently the divalent residues of the aromatic heterocycles explained in Ar of Formula (1) described above.

In Formula (2), Ar' is preferably phenylene, biphenylene, pyridinediyl, pyrimidinediyl, triazinediyl, phenylpyrimidinediyl or phenylpyridinediyl.

In Formula (2), the examples of the aromatic hydrocarbon group represented by $R_A$ and $R_B$ each include independently the monovalent residues of the aromatic hydrocarbons explained in Ar of Formula (1) described above.

In Formula (2), the examples of the aromatic heterocyclic group represented by $R_A$ and $R_B$ each include independently the monovalent residues of the aromatic heterocycles explained in Ar of Formula (1) described above.

In the organic EL device of the present invention, halides containing the halogen elements described above which are impurities of the host material contained in the organic thin film layer described above include those having at least one structure represented by the following Formulas (3) to (5) and those having at least one structure represented by the following Formulas (6) and/or (7):

(3)

(4)

(5)

In Formulas (3) to (5), Ar, $R_A$ and $R_B$ are the same as described above, and the examples thereof are the same as those explained in Formula (1) described above.

In Formula (3), $X_1$ represents a halogen atom and includes, for example, fluorine, chlorine, bromine and iodine. In particular, those in which $X_1$ is bromine, chlorine or iodine are preferably reduced.

In Formula (4), one of $X_2$ to $X_3$ represents a halogen atom, and the remainder represents a halogen atom or a hydrogen atom. The examples of the halogen atom are the same as in $X_1$ described above.

In Formula (5), at least one of $X_4$ to $X_6$ represents a halogen atom, and the remainder represents a halogen atom or a hydrogen atom. The examples of the halogen atom are the same as in $X_1$ described above.

Provided that when $X_2$ to $X_6$ are hydrogen atoms, Ar is reduced in a valency according to the number of the hydrogen atoms. Further, when two or more of $X_2$ to $X_3$ or $X_4$ to $X_6$ are halogen atoms, they may the same atom.

$$R_4\text{—}Ar'\text{—}X_1 \qquad (6)$$

$$X_2\text{—}Ar'\text{—}X_3 \qquad (7)$$

In Formulas (6) to (7), Ar' and $R_4$ are the same as described above, and the examples thereof are the same as those explained in Formula (2) described above.

In Formula (6), $X_1$ is the same as described above.

In Formula (7), $X_2$ to $X_3$ are the same as described above.

Provided that when $X_2$ to $X_6$ are hydrogen atoms, Ar' is reduced in a valency according to the number of the hydrogen atoms. Further, when two or more of $X_2$ to $X_3$ are halogen atoms, they may the same atom.

In the organic EL device of the present invention, the light-emitting layer described above contains preferably the aromatic hydrocarbon compound and the aromatic heterocyclic compound having the structure represented by Formula (1) and/or (2) described above.

In the organic EL device of the present invention, the light-emitting layer described above sometimes contains as an impurity, the halide having at least one of the structures represented by Formulas (3) to (5) described above or the halide having the structure represented by Formulas (6) and/or (7) described above.

The aromatic hydrocarbon compound and the aromatic heterocyclic compound used in the present invention are preferably the host material for the organic EL device. This host material can inject a hole and an electron and has a function to transport a hole and/or an electron and recombine them to emit fluorescence.

The compounds represented by Formulas (1) and (2) which are used in the present invention have preferably a high singlet energy gap of 2.8 to 3.8 eV and a high triplet energy gap of 2.4 to 3.3 eV, and they are useful as a host material for a phosphorescent device. In this case, the phosphorescent device means an organic electroluminescent device making use of so-called fluorescence and containing a substance in which a luminescence intensity based on transition from the energy state of a triplet level to the state of a ground singlet level is higher than those of other substances, for example, a phosphorescent substance such as an organic metal complex containing at least one metal selected from the 7th to 11th group in the periodic table.

The organic EL device of the present invention is a device in which an organic thin film layer comprising a single layer or plural layers is formed, as described above, between an anode and a cathode. In the case of the single layer type, a phosphorescence light-emitting layer is provided between an anode and a cathode. The phosphorescence light-emitting layer contains the luminescent material, and in addition thereto, it may contain a hole injecting material or an electron injecting material in order to transport a hole injected from the anode or an electron injected from the cathode to the luminescent material. The luminescent material has a very high fluorescent quantum efficiency, a high hole transporting ability and a high electron transporting ability in combination, and an even thin film is preferably formed. The organic EL device of a multilayer type includes devices laminated in a multilayer structure of (anode/hole transporting layer (hole injecting layer)/light-emitting layer/cathode), (anode/light-emitting layer/electron transporting layer (electron injecting layer)/cathode) and (anode/hole transporting layer (hole injecting layer)/light-emitting layer/electron transporting layer (electron injecting layer)/cathode).

Publicly know host materials, luminescent materials, doping materials, hole injecting materials and electron injecting materials in addition to the luminescent materials described above can further be used, if necessary, for the phosphorescence light-emitting layer, and they can be used as well in combination. The organic EL device can be prevented from being reduced in a luminance and a life due to quenching by providing with a multilayer structure, and other doping materials make it possible to improve the emission luminance and the luminous efficiency. Use thereof in combination with other doping materials contributing to phosphorescence makes it possible to improve the existing emission luminance and luminous efficiency.

The hole transporting layer, the light-emitting layer and the electron transporting layer-in the organic EL device of the present invention may be formed respectively by a layer structure of two or more layers. In this case, in the case of the hole transporting layer, a layer for injecting a hole from an electrode is called a hole injecting layer, and a layer for receiving a hole from a hole injecting layer and transporting it to a light-emitting layer is called a hole transporting layer. Similarly, in the case of the electron transporting layer, a layer for injecting an electron from an electrode is called an electron injecting layer, and a layer for receiving an electron from the electron injecting layer and transporting it to the light-emitting layer is called an electron transporting layer. The above respective layers are selected based on the respective factors such as an energy level of the materials, a heat resistance and an adhesion with the organic thin film layer or the metal electrode and used.

In the organic EL device of the present invention, the electron transporting layer and the hole transporting layer may contain the aromatic hydrocarbon compound and/or the aromatic heterocyclic compound each described above, and the hole injecting layer, the electron injecting layer and the hole blocking layer may contain the compounds described above. They may be used in a mixture with the phosphorescent compound.

The luminescent material or the host material which can be used for the organic thin film layer together with the aromatic hydrocarbon compound and/or the aromatic heterocyclic compound each described above includes anthracene, naphthalene, phenanthrene, pyrene, tetracene, coronene, chrysene, fluorescein, perylene, phthaloperylene, naphthaloperylene, perynone, phthaloperynone, naphthaloperynone, diphenylbutadiene, tetraphenylbutadiene, coumarin, oxadiazole, aldazine, bisbenzoxazoline, bisstyryl, pyrazine, cyclopentadiene, quinoline metal complexes, aminoquinoline metal complexes, benzoquinoline metal complexes, imine, diphenylethylene, vinylanthracene, diaminoanthracene, diaminocarbazole, pyran, thiopyran, polymethine, merocyanine, imidazole chelated oxynoid compounds, quinacridone, rubrene, stilbene base derivatives and fluorescent coloring matters. However, it shall not be restricted to them.

In the organic EL device of the present invention, the light-emitting layer contains preferably, together with the aromatic hydrocarbon compound and/or the aromatic heterocyclic compound each described above, at least one selected from phosphorescent organic metal compounds as a luminescent material in terms of being able to raise more an external quantum efficiency of the device.

Metal atoms for the organic metal compounds include metal complexes containing ruthenium, rhodium, palladium, silver, rhenium, osmium, iridium, platinum and gold. Metal complexes containing osmium, iridium and platinum are preferred, and iridium complexes and platinum complexes are more preferred. Ortho-metallized iridium complexes are most preferred.

A compound represented by the following Formula (V) is given as the organic metal compound:

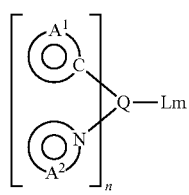

(V)

(wherein $A^1$ represents a substituted or non-substituted aromatic carbocyclic group or a substituted or non-substituted aromatic heterocyclic group, and it is preferably a phenyl group, a biphenyl group, a naphthyl group, an anthryl group, a thienyl group, a pyridyl group, a quinolyl group or an isoquinolyl group; the substituent described above represents a halogen atom such as a fluorine atom and the like, an alkyl group having 1 to 30 carbon atoms such as methyl, ethyl and the like, an alkenyl group such as vinyl and the like, an alkoxycarbonyl group having 1 to 30 carbon atoms such as methoxycarbonyl, ethoxycarbonyl and the like, an alkoxy group having 1 to 30 carbon atoms such as methoxy, ethoxy and the like, an aryloxy group such as phenoxy, benzyloxy and the like, a dialkylamino group such as dimethylamino, diethylamino and the like, an acyl group such as acetyl and the like, a haloalkyl group such as trifluoromethyl and a cyano group;

$A^2$ represents a substituted or non-substituted aromatic heterocyclic group containing nitrogen as an atom for forming a heterocycle, and it is preferably a pyridyl group, a pyrimidyl group, a pyrazine group, a triazine group, a benzothiazole group, a benzoxazole group, a benzimidazole group, a quinolyl group, an isoquinolyl group, a quinoxaline group, a phenanthridine group, an imidazopyridine group, an indole group, a diazole group or a triazole group; and the substituent described above includes the same ones as those represented by $A^1$;

a ring containing $A^1$ and a ring containing $A^2$ may form one condensed ring, and such ring includes, for example, 7,8-benzoquinoline;

Q is metal selected from the 7th to 11th groups in the periodic table, and it represents preferably ruthenium, rhodium, palladium, silver, ruthenium, osmium, iridium, platinum or gold;

L represents a bidentate ligand and is selected preferably from ligands of a β-diketo type such as acetyl acetonate, picolinic acid ligands, phenylpyridine base ligands, benzoquinoline base ligands, quinolinol base ligands, bipyridyl base ligands, phenanthroline base ligands, phosphine base ligands, phosphite base ligands, phosphine base ligands, pyridinyldiazole base ligands and pyridinyltriazole base ligands;

m and n represent an integer; when Q is divalent metal, n is 2, and m is 0; when Q is trivalent metal, n is 3, and m is 0 or n is 2, and m is 1).

The specific examples of the organic metal compound represented by Formula (V) described above shall be shown below, but they shall by no means be restricted to the following compounds.

(k-1) to (k-42)

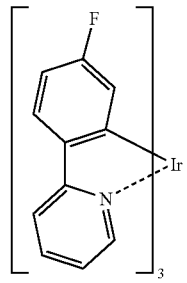

(K-1)

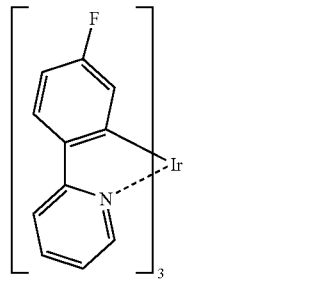

(K-2)

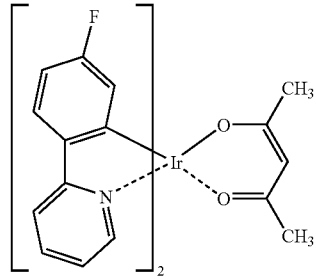

(K-3)

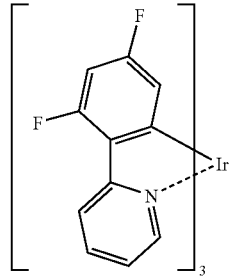

(K-4)

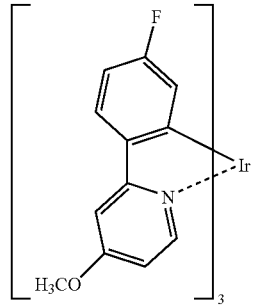

(K-5)

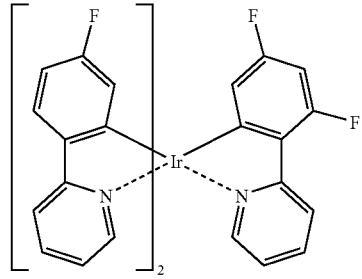

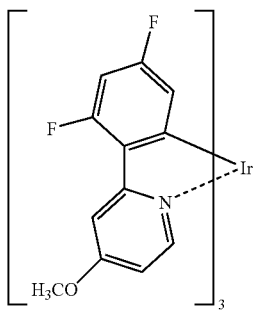
(K-6)
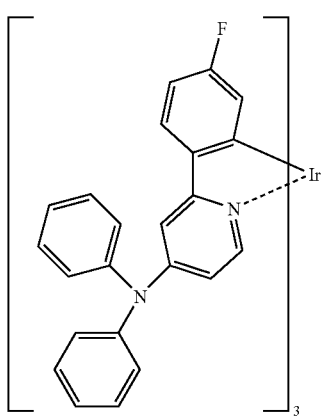
(K-7)
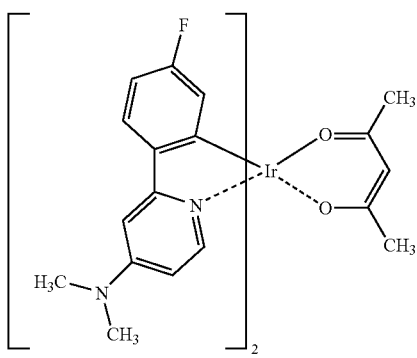
(K-8)
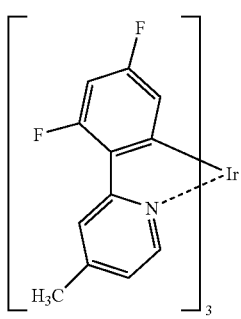
(K-9)
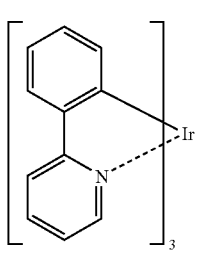
(K-10)
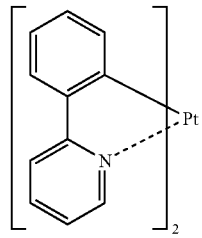
(K-11)
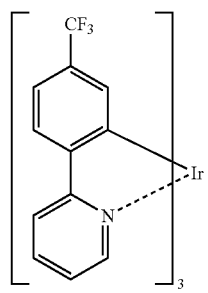
(K-12)
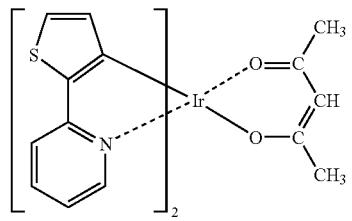
(K-13)
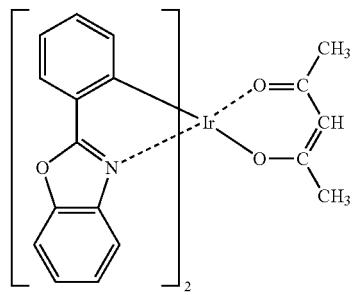
(K-14)
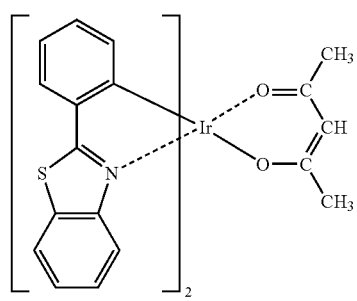
(K-15)

(K-17)
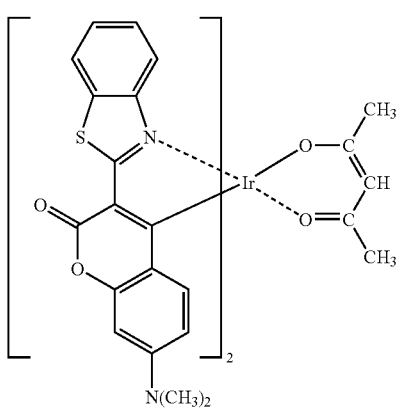
(K-18)
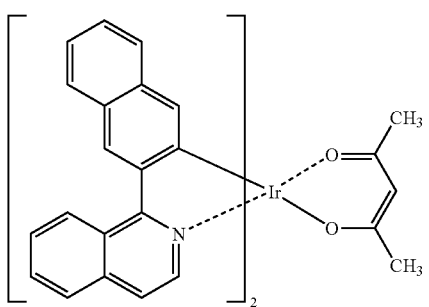
(K-19)
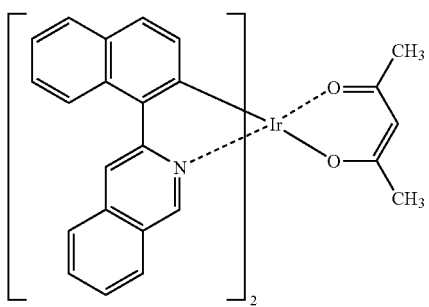
(K-20)
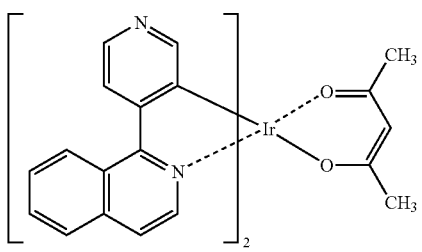
(K-21)
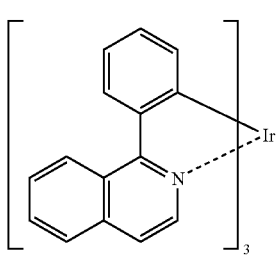
(K-22)
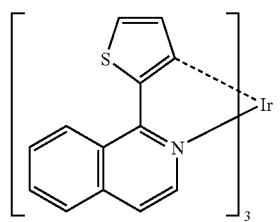
(K-23)
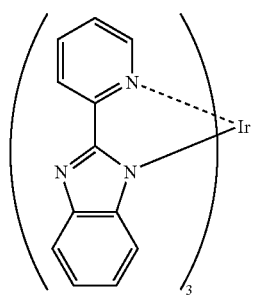
(K-24)
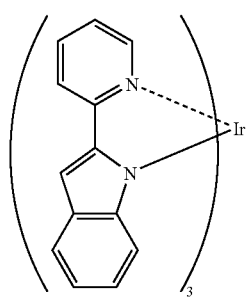
(K-25)
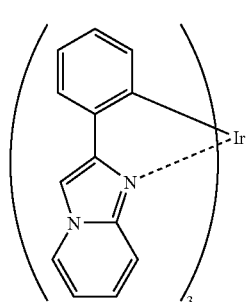
(K-26)
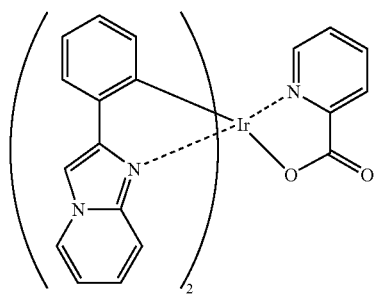

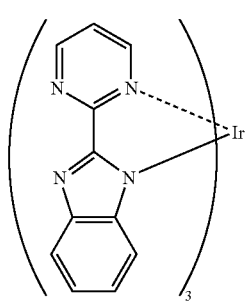 (K-27)
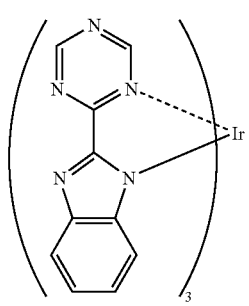 (K-28)
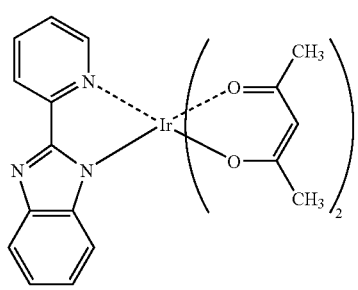 (K-29)
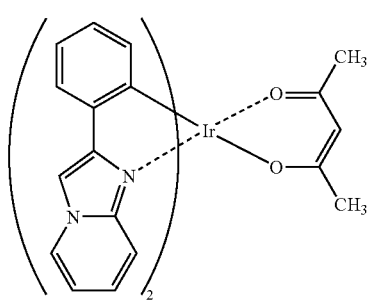 (K-30)
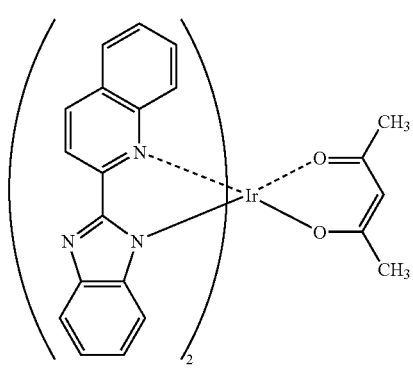 (K-31)
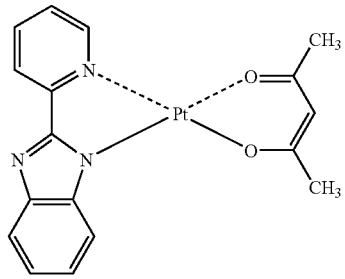 (K-32)
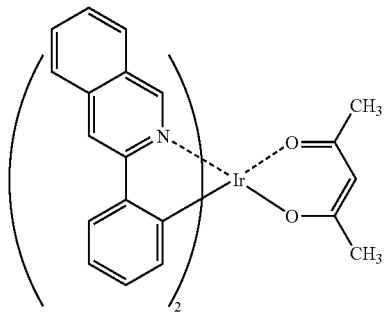 (K-33)
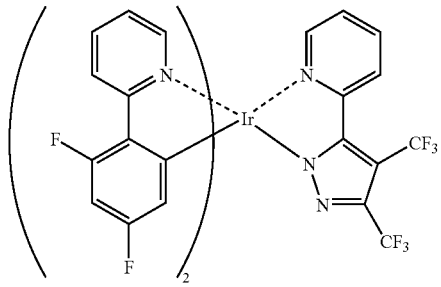 (K-34)
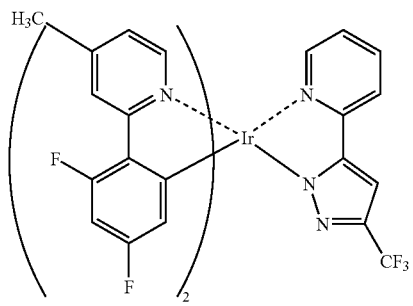 (K-35)
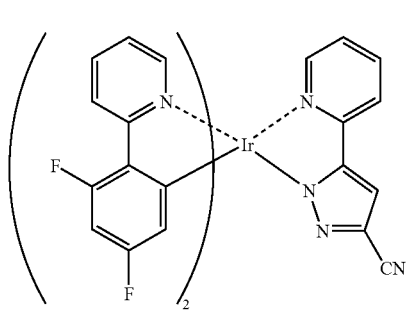 (K-36)

(K-37)
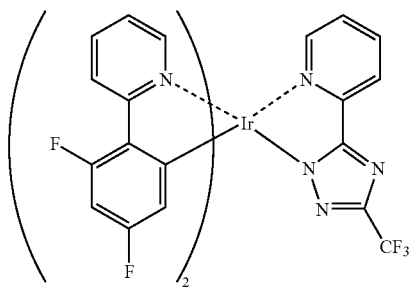

(K-42)
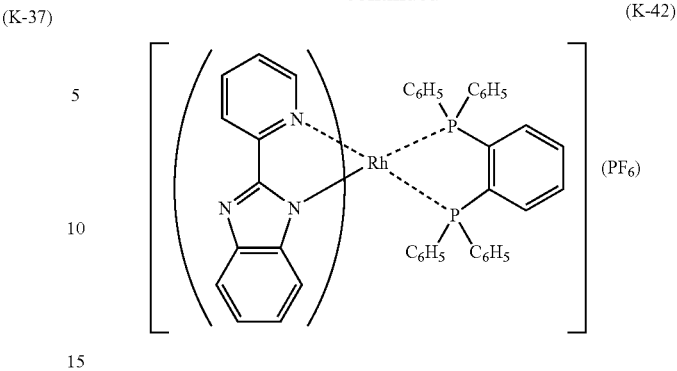

(K-38)
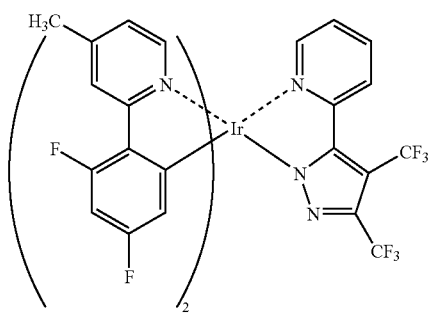

(K-39)
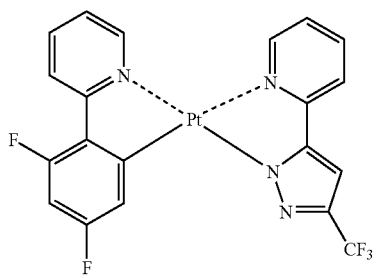

(K-40)
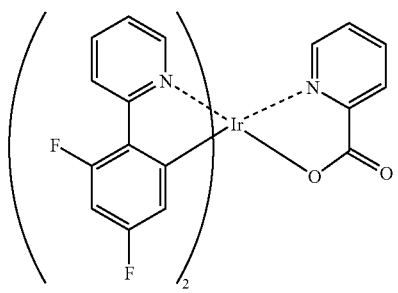

(K-41)
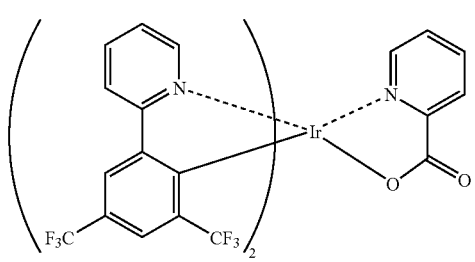

Preferred as the hole injecting material are compounds which are provided with ability to transport holes and have an effect of injecting holes from an anode and an excellent effect of injecting holes into a light-emitting layer or a luminescent material and which prevent excitons formed in the light-emitting layer from transferring to an electron injecting layer or an electron injecting material and are excellent in a thin film-forming ability. To be specific, they include phthalocyanine derivatives, naphthalocyanine derivatives, porphyrin derivatives, oxazole, oxadiazole, triazole, imidazole, imidazolone, imidazolethione, pyrazoline, pyrazolone, tetrahydroimidazole, oxazole, oxadiazole, hydrazone, acylhydrazone, polyarylalkane, stilbene, butadiene, benzidine type triphenylamine, styrylamine type triphenylamine, diamine type triphenylamine and derivatives thereof and high molecular materials such as polyvinylcarbazole, polysilane and conductive polymers, but they shall not be restricted thereto.

Among the above hole injecting materials, more effective hole injection materials are aromatic tertiary amine derivatives or phthalocyanine derivatives. The specific examples of the aromatic tertiary amine derivatives are triphenylamine, tritolylamine, tolyldiphenylamine, N,N'-diphenyl-N,N'-(3-methylphenyl)-1,1'-biphenyl-4,4'-diamine, N,N,N',N'-(4-methylphenyl)-1,1'-phenyl-4,4'-diamine, N,N,N',N'-(4-methylphenyl)-1,1'-biphenyl-4,4'-diamine, N,N'-diphenyl-N,N'-dinaphthyl-$_{1,1}$'-biphenyl-4,4'-diamine, N,N'-(methylphenyl)-N,N'-(4-n-butylphenyl)-phenanthrene-9,10-diamine, 4,4',4"-tris(carbazole-9-yl)-triphenylamine, 4,4',4"-tris(N,N-diphenylamino)-triphenylamine, 4,4',4"-tris(N-3-methylphenyl-N-phenylamino)-triphenylamine, N,N-bis(4-di-triaminophenyl)-4-phenyl-cyclohexane and oligomers or polymers having the above aromatic tertiary amine skeletons, but they shall not be restricted thereto. The specific examples of the phthalocyanine (Pc) derivatives include phthalocyanine derivatives such as $H_2Pc$, CuPc, CoPc, NiPc, ZnPc, PdPc, FePc, MnPc, ClAlPc, ClGaPc, ClInPc, ClSnPc, $Cl_2SiPc$, (HO)AlPc, (HO)GaPc, VoPc, TiOPc, MoOPc and GaPc-O—GaPc and naphthalocyanine derivatives, but they shall not be restricted thereto.

In addition to the hole injecting materials, a hole blocking material can be used. The hole blocking material shall not specifically be restricted and includes basophproline (BCP) and 4-biphenyloxolate aluminum (III) bis(2-methyl-8-quinolinate)-4-phenylphenolate (BAlq).

The hole injecting materials and the hole blocking material each described above are also used as a material for the hole transporting layer (hole injecting layer).

Preferred as the electron injecting materials are compounds which are provided with ability to transport electrons and have an effect of injecting electrons from a cathode and an excellent effect of injecting electrons into a light-emitting layer or a luminescent material and which prevent excitons formed in the light-emitting layer from transferring to a hole injecting layer and are excellent in a thin film-forming ability. To be specific, they include fluorenone, anthraquinodimethane, diphenoquinone, thiopyran dioxide, oxazole, oxadiazole, triazole, imidazole, perylenetetracarboxylic acid, quinoxaline, fluorenilidenemethane, anthraquinodimethane, anthrone, derivatives thereof and silane compounds, but they shall not be restricted thereto.

Among the above electron injecting materials, more effective electron injecting materials are metal complex compounds or nitrogen-containing cyclic derivatives. The specific examples of the metal complex compounds include lithium 8-hydroxyquinolinate, zinc bis(8-hydroxyquinolinate), copper bis(8-hydroxyquinolinate), manganese bis(8-hydroxyquinolinate), aluminum tris(8-hydroxyquinolinate), aluminum tris(2-methyl-8-hydroxyquinolinate), gallium tris (8-hydroxyquinolinate), beryllium bis(10-hydroxybenzo[h]quinolinate), zinc bis(10-hydroxybenzo[h]quinolinate), chlorogallium bis(2-methyl-8-quinolinate), gallium bis(2-methyl-8-quinolinate) (o-crezolate), aluminum bis(2-methyl-8-quinolinate) (o-naphtholate), aluminum bis(2-methyl-8-quinolinate) (1-naphtholate) and gallium bis(2-methyl-8-quinolinate) (2-naphtholate), but they shall not be restricted thereto.

Aromatic heterocyclic compounds containing at least one hetero atom in a molecule are preferably used for the nitrogen-containing cyclic derivatives. The specific compounds of the above nitrogen-containing cyclic derivatives are preferably compounds having an azole skeleton which is a five-membered ring. The compounds having an azole skeleton are compounds having two or more atoms other than a carbon atom and a hydrogen atom in a fundamental skeleton, and they may be monocycles or condensed rings. The nitrogen-containing derivatives described above are preferably compounds having two or more atoms selected from N, O and S atoms, more preferably compounds having at least one N atom in a skeleton and further preferably compounds having two or more N atoms in the skeleton. The hetero atoms may be situated in a condensed position or in a non-condensed position. The nitrogen-containing derivatives having two or more hetero atoms include preferably, for example, pyrazole, imidazole, pyrazine, pyrimidine, indazole, purine, phthalazine, naphthyridine, quinoxaline, quinazoline, cinnoline, pteridine, perimizine, phenanthroline, pyrroloimidazole, pyrrolotriazole, pyrazoloimidazole, pyrazolotriazole, pyrazolopyrimidine, pyrazolotriazine, imidazoimidazole, imidazopyridazine, imidazopyridine, imidazopyrazine, triazolopyridine, benzimidazole, napthimidazole, benzoxazole, napthoxazole, benzotriazole, tetrazaindene and triazine. Among them, more preferred as the above electron transporting host material are compounds having a condensed azole skeleton or compounds having a triazine skeleton such as imidazopyridazine, imidazopyridine, imidazopyrazine, benzimidazole and napthimidazole, and condensed imidazopyridine is further preferred.

The above electron injecting materials can also be used as materials for the electron transporting layer (electron injecting layer).

Further, the charge injecting property can be improved as well by adding an electron receiving substance to the hole injecting materials and an electron donating substance to the electron injecting materials.

A conductive material used for an anode in the organic EL device of the present invention is suitably a material having a work function of larger than 4 eV, and used therefor are carbon, aluminum, vanadium, iron, cobalt, nickel, tungsten, silver, gold, platinum, palladium and alloys thereof, metal oxides such as tin oxide and indium oxide which are used for an ITO substrate and an NESA substrate and organic conductive resins such as polythiophene and polypyrrole. The conductive material used for the cathode is suitably a material having a work function of smaller than 4 eV, and used therefor are magnesium, calcium, tin, lead, titanium, yttrium, lithium, ruthenium, manganese, aluminum and alloys thereof, but it shall not be restricted to them. The representative examples of the alloys include magnesium/silver, magnesium/indium and lithium/aluminum, but it shall not be restricted to them. A proportion of the alloys is controlled according to a temperature of the vapor deposition source, the atmosphere and the vacuum degree, and the suitable proportion is selected. The anode and the cathode may be formed, if necessary, in a layer structure of two or more layers.

The organic EL device of the present invention may have an inorganic compound layer between at least one electrode and the organic thin film layer described above. Preferred inorganic compounds used for the inorganic compound layer are various oxides, nitrides and nitride oxides such as alkaline metal oxides, alkaline earth metal oxides, rare earth oxides, alkaline metal halides, alkaline earth metal halides, rare earth halides, $SiO_x$, $AlO_x$, $SiN_x$, SiON, AlON, $GeO_x$, $LiO_x$, LiON, $TiO_x$, TiON, $TaO_x$, TaON, $TaN_x$, and C. In particular, $SiO_x$, $AlO_x$, $SiN_x$, SiON, AlON, $GeO_x$, $CeO_x$ and C are preferred as a component for the layer brought into contact with the anode since a stable injecting interfacial layer is formed. In particular, LiF, $MgF_2$, CaF2 and NaF are preferred as a component for the layer brought into contact with the cathode.

It is preferred that at least one face of the organic EL device of the present invention is sufficiently transparent in an emission wavelength region of the device in order to efficiently emit light. Further, the substrate is preferably transparent as well.

A transparent electrode is set up by a method such as vapor deposition and sputtering using the conductive materials described above so that a prescribed translucency is secured. An electrode on a luminescent face is set preferably to a light transmittance of 10% or more. The substrate shall not be restricted as long as it has a mechanical and thermal strength and is transparent, and it includes a glass substrate and a transparent resin film. The transparent resin film includes polyethylene, ethylene-vinyl acetate copolymers, ethylene-vinyl alcohol copolymers, polypropylene, polystyrene, polymethyl methacrylate, polyvinyl chloride, polyvinyl alcohol, polyvinyl butyral, nylon, polyether ether ketone, polysulfone, polyethersulfone, tetrafluoroethylene-perfluoroalkyl vinyl ether copolymers, polyvinyl fluoride, tetrafluoroethylene-ethylene copolymers, tetrafluoroethylene-hexafluoropropylene copolymers, polychlorotrifluoroethylene, polyvinylidene fluoride, polyester, polycarbonate, polyurethane, polyimide, polyetherimide, polyimide and polypropylene.

In the organic EL device of the present invention, it is possible to provide a protective layer on the surface of the device and protect the whole part of the device by silicon oil, a resin and the like in order to enhance the stability against temperature, humidity and environment.

Either method of a dry film-forming method such as vacuum vapor deposition, sputtering, plasma and ion plating and a wet film-forming method such as spin coating, dipping and flow coating can be applied for forming the organic EL device of the present invention. The film thicknesses of the respective layers shall not specifically be restricted, and the appropriate film thicknesses have to be set up. If the film thicknesses are too large, large voltage has to be applied in order to obtain a constant light output, and the luminous efficiency becomes inferior. If the film thicknesses are too small, pinholes are produced, and the satisfactory emission luminance is not obtained when applying an electric field. The ordinary film thicknesses fall in a range of suitably 5 nm to 10 μm, more preferably 10 nm to 0.2 μm.

In the case of the wet film-forming method, materials for forming the respective layers are dissolved or dispersed in an appropriate solvent such as ethanol, chloroform, tetrahydrofuran, dioxane and the like to form thin films, and the solvent may be any ones. Further, appropriate resins and additives may be used in all layers in order to enhance a film-forming property and prevent pinholes from being produced on the films. The resins which can be used include insulating resins such as polystyrene, polycarbonate, polyallylate, polyester, polyamide, polyurethane, polysulfone, polymethyl methacrylate, polymethyl acrylate and cellulose and copolymers thereof, photoconductive resins such as poly-N-vinylcarbazole and polysilane and conductive resins such as polythiophene and polypyrrole. Further, the additives include antioxidants, UV absorbers, plasticizers and the like.

EXAMPLES

Next, the present invention shall be explained in further details with reference to examples, but the present invention shall not be restricted to these examples.

In the examples and the comparative examples, ICP-MS analysis was carried out on the following use conditions. Agilent 7500a (manufactured by Yokogawa Analytical Systems, Inc.) was used for an apparatus of ICP-MS analysis. A burning part of a TSX-10 type (manufactured by Mitsubishi Chemical Corporation) manufactured by Dia Instruments Co., Ltd. as a burning-alkali absorption pretreating apparatus was used for pretreatment of the sample.

Br (bromine) Analysis

An alkali absorption formulated concentrate 0.75 ml of 88 mmol/l $Na_2CO_3$/24 mmol/l $NaHCO_3$ and 100 μl of $H_2O_2$ was put in an absorbing tube disposed in an outlet of the pretreating apparatus, and the amount was adjusted to 15 ml with purified aqueous water. In this case, the respective alkali concentrations were 4.4 mmol/l of $Na_2CO_3$ and 1.2 mmol/l of $NaHCO_3$. $H_2O_2$ was added in order to reduce $Br_2$ to HBr which is absorbed in the alkali absorbing solution since a part of Br was expected to be turned into $Br_2$ which is not absorbed in the alkali absorbing solution. Next, 50 mg of the sample was put in a burning boat, burned and held for about 15 minutes. Then, purified water 100 μl was put in the burning boat and held for about one minute in a prescribed place (Br adhered up to the line of the absorbing solution was recovered). Br of this solution was determined by means of an ICP-MS analytical device set up to prescribed conditions. Since matrix matching of a measured solution and a standard solution exerts a large effect on the accuracy in determination by ICP-MS analysis, the matrix matching was carried out. Addition of $H_2O_2$ to the alkali absorbing solution in burning-alkali absorption is indispensable in order to reduce $Br_2$ to HBr and allow it to be absorbed completely in the absorbing solution. After burning the sample, purified water was transferred to a fixed position in a burning furnace to generate steam, whereby Br adhered to an absorbing vessel was recovered to attempt to enhance the yield.

In respect to an amount of the sample required for obtaining a yield of 90% or more, an optional amount of a tetra-n-butylammonium bromide ($[CH_3(CH_2)]_4N.Br$)/toluene solution was taken and subjected to burning-alkali absorption to determine the yield, which resulted in finding that it was enough to burn 50 mg of the sample.

I (iodine) Analysis

It was carried out in the same manner as in Br analysis, and the same amount of a 5% aqueous solution hydrazine was used in analysis of I in place of $H_2O_2$ which was used in order to reduce $Br_2$ in Br analysis. This hydrazine was used in order to reduce $I_2$ and allow it to be absorbed completely in the absorbing solution. In respect to an amount of the sample required for obtaining a yield of 90% or more, an optional amount of a tetra-n-butylammonium iodide ($[CH_3(CH_2)]_4N.I$)/toluene solution was taken and subjected to burning-alkali absorption to determine the yield, which resulted in finding that it was enough to burn 50 mg of the sample as was the case with Br.

In the examples and the comparative examples, coulometric titration analysis was carried out on the following use conditions.

TSX-100 (manufactured by Dia Instruments Co., Ltd.) was used for a coulometric titration device. An electrolytic solution, a counter electrode solution, an internal solution of a reference electrode and an external solution of the reference electrode which were used for titration were prepared in the following manners, or solutions having the following concentrations were used.

Electrolytic solution: 675 mg of anhydrous sodium acetate was dissolved in 425 ml of acetic acid, and purified water was added to adjust the whole amount to 500 ml.

Counter electrode solution: purified water was added to 50 g of potassium nitrate to adjust the whole amount to 500 ml.

Internal solution of reference electrode: a 1M potassium chloride solution was used.

External solution of reference electrode: a 1M potassium nitrate solution was used.

Each 30 mg of all samples was weighed and put in a burning boat made of quartz. The sample was heated to 900° C. while allowing argon gas to flow and then completely burned while allowing oxygen to flow, and gas generated passed through a heating pipe, went through a dehydrating bath and was introduced into a titration cell and titrated.

Example 1 and the Comparative example 1

A luminescent material 1 (hereinafter referred to as the [Host 1]) was synthesized according to a synthetic scheme shown below:

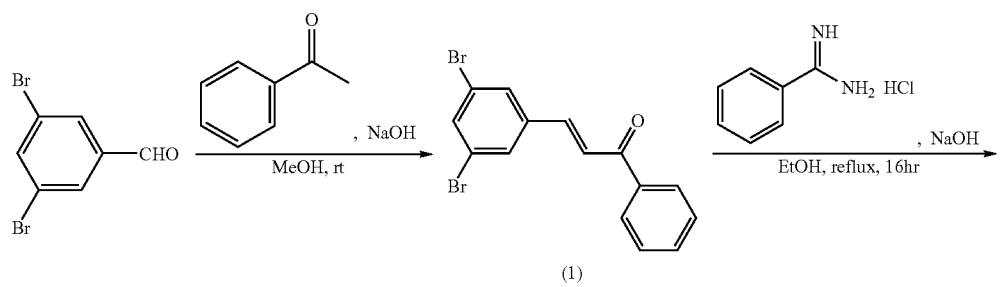

(1)

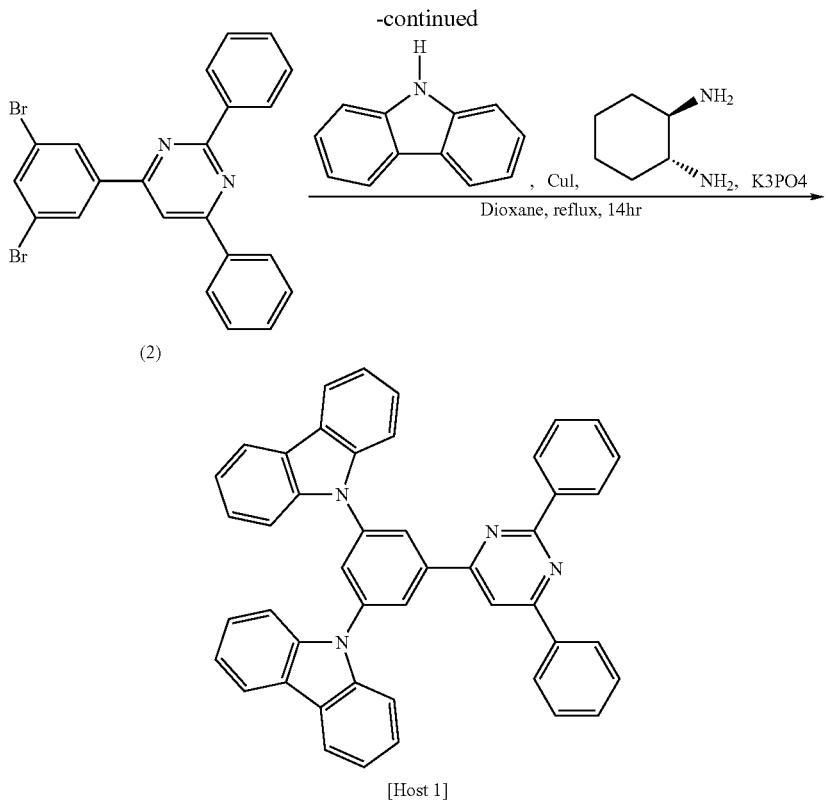

[Host 1]

The compound [Host 1] was synthesized in the following manner.

Synthesis of Synthetic Intermediate (1)

Dissolved in 200 ml of methanol were 18.0 g (68 mmol) of 3,5-dibromobenzaldehyde and 9.0 g (75 mmol) of acetophenone, and 70 ml (70 mmol) of a 1M sodium hydroxide aqueous solution was dropwise added thereto, followed by stirring the solution at room temperature for 30 minutes. After finishing the reaction, crystal deposited was filtered and washed with methanol to obtain 20.4 g (yield: 82%) of a synthetic intermediate (1).

Synthesis of Synthetic Intermediate (2)

Suspended in 70 ml of ethanol were 10.0 g (27 mmol) of the synthetic intermediate (1) and 4.4 g (28 mmol) of benzamidine hydrochloride, and 3.3 g (60 mmol) of sodium hydroxide was added thereto, followed by heating and refluxing the solution for 18 hours. The reaction solution was cooled down to room temperature, and 40 ml of water was added thereto and stirred for one hour. Then, crystal deposited was filtered and washed with methanol to obtain 6.2 g (yield: 49%) of a synthetic intermediate (2). The resulting crystal was confirmed to be the synthetic intermediate (2) by means of 90 MHz $^1$H—NMR and FD-MS (field desorption mass spectrum). The measured result of FD-MS is shown below.

FD-MS: calculated for $C_{22}H_{14}N_2Br_2$=466, found, m/z=466 (M$^+$, 100)

Further, a lowest excited triplet energy level T1 was measured. The solution had a concentration of 10 μmol/l, and EPA (diethyl ether:isopentane:isopropyl alcohol=5:5:2 volume ratio) was used for the solvent. Phosphorescence was measured at 77K in a quartz cell by means of a fluorophotometer F-4500 manufactured by Hitachi, Ltd. A tangent line was drawn against build up of luminescence at a short wavelength side in the resulting phosphorescent spectrum to determine a wavelength (emission end) which was an intersecting point with an axis of ordinate, and this wavelength was converted to an energy value. As a result thereof, the lowest excited triplet energy level T1 was 2.9 eV.

Synthesis of Compound [Host 1]

Suspended in 21 ml of 1,4-dioxane were 3.0 g (6.4 mmol) of the intermediate (2), 2.3 g (14 mmol) of carbazole, 0.12 g (0.6 mmol) of copper iodide and 4.2 g (20 mmol) of potassium phosphate, and 0.8 ml (6.4 mmol) of trans-1,2-cyclohexanediamine was added thereto. The mixture was heated and refluxed for 18 hours under argon atmosphere. The reaction solution was cooled down to room temperature, and then methylene chloride and water were added thereto in order. The solution was separated into two layers, and then the organic layer separated was washed with water and dried on anhydrous sodium sulfate. After distilling the organic solvent off under reduced pressure, the residue was suspended in 21 ml of dioxane, and 0.12 g (0.6 mmol) of copper iodide, 2.9 g (14 mmol) of potassium phosphate and 0.8 ml (6 mmol) of trans-1,2-cyclohexanediamine were added thereto. The mixture was heated and refluxed for 18 hours under argon atmosphere. The reaction solution was cooled down to room temperature, and methylene chloride and water were added thereto. The solution was separated into two layers, and then the organic layer separated was washed with water and dried on anhydrous sodium sulfate. After distilling the organic solvent off under reduced pressure, 30 ml of ethyl acetate was added thereto to filter crystal deposited, and subsequently it was washed with ethyl acetate to obtain 3.5 g (yield: 85%) of yellowish white crystal. The resulting crystal was confirmed to be the objective substance [Host 1] by means of 90 MHz $^1$H—NMR and FD-MS. The measured result of FD-MS is shown below.

FD-MS: calculated for $C_{46}H_{30}N_4$=638, found, m/z=638 (M+, 100)

The above unrefined [Host 1] was analyzed by mass spectrometry to confirm one impurity peak (halide (A)).

This impurity was separated, refined and analyzed by means of 90 MHz $^1$H—NMR and FD-MS to result in identifying that the halide (A) had the following structure:

$^1$H—NMR (90 MHz, CDCl$_3$): 7.2 to 8.8 (m, 22 H) FD-MS: calculated for $C_{34}H_{22}N_3Br$=551, found, m/z=551, 553

(A)

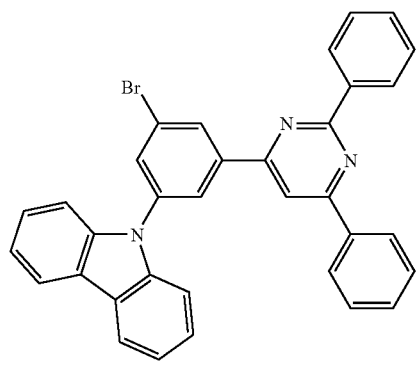

Further, a lowest excited triplet energy level T1 was measured. The solution had a concentration of 10 µmol/l, and EPA (diethyl ether:isopentane:isopropyl alcohol=5:5:2 volume ratio) was used for the solvent. Phosphorescence was measured at 77K in a quartz cell by means of a fluorophotometer F-4500 manufactured by Hitachi, Ltd. A tangent line was drawn against build up of luminescence at a short wavelength side in the resulting phosphorescent spectrum to determine a wavelength (emission end) which was an intersecting point with an axis of ordinate, and this wavelength was converted to an energy value. As a result thereof, the lowest excited triplet energy level T1 was 2.9 eV. Further, the [Host 1] was analyzed by ICP-MS to result in finding that the bromine mass concentration and the iodine mass concentration were 325 ppm and 10 ppm in order respectively. The above [Host 1] was subjected to chlorine analysis by coulometric titration to result in finding that the chlorine mass concentration was 22 ppm.

Next, this unrefined [Host 1] was sublimated and refined on the conditions of a boat temperature of 340° C. and 1 Pa for the purpose of separating impurities to obtain pale yellow powder. Hereinafter, this is referred to as the refined [Host 1]. This refined [Host 1] was analyzed by ICP-MS to result in finding that the bromine mass concentration and the iodine mass concentration were 17 ppm and 5 ppm in order respectively. Chlorine analysis was carried out by coulometric titration to result in finding that the chlorine mass concentration was 7 ppm.

Next, the unrefined [Host 1] and the refined [Host 1] were used as materials for a light-emitting layer to prepare two kinds of organic EL devices having the following structures, wherein the device using the unrefined [Host 1] is referred to as a device 1 (Comparative Example 1), and the device using the refined [Host 1] is referred to as a device 2 (Example 1).

Device 1 (Comparative Example 1): ITO/α-NPD/unrefined [Host 1] and Ir(ppy)$_3$/BAlq/Alq/LiF/Al Device 2 (Example 1): ITO/α-NPD/refined [Host 1] and Ir(ppy)$_3$/BAlq/Alq/LiF/Al The organic EL devices were prepared in the following manner.

A glass substrate of 25 nm×75 mm×0.7 mm thickness quipped with a transparent electrode was subjected to ultrasonic cleaning in isopropyl alcohol for 5 minutes and then subjected to UV ozone cleaning for 30 minutes. After cleaning, the glass substrate quipped with a transparent electrode was mounted in a substrate holder of a vacuum deposition apparatus, and the following 4,4'-bis[N-(1-naphthyl)-N-phenylamino]biphenyl film (abbreviated as the "α-NPD film") having a film thickness of 40 nm was formed on a face of a side in which the transparent electrode was formed so that the transparent electrode described above was covered. This α-NPD film functions as a hole transporting layer. Further, following the formation of the α-NPD film, the [Host 1] was deposited as a host material on the above α-NPD film to form a light-emitting layer having a film thickness of 30 nm. Simultaneously, tris(2-phenylpyridine)Ir (hereinafter abbreviated as "Ir(ppy)$_3$") shown below was added as a phosphorescent Ir metal complex dopant. A concentration of Ir(ppy)$_3$ in the light-emitting layer was set to 5 mass %. This film functions as a light-emitting layer. A film of (1,1'-bisphenyl)-4-oleate)bis(2-methyl-8-quinolinolate)aluminum shown below (hereinafter abbreviated as the "BAlq film") having a film thickness of 10 nm was formed on the above film. This BAlq film functions as a hole blocking layer. Further, a film of an aluminum complex of 8-hydroxyquinoline shown below (hereinafter abbreviated as the "Alq film") having a film thickness of 40 nm was formed on the above film. This Alq film functions as an electron injecting layer. Thereafter, LiF which is alkali metal halide was deposited in a thickness of 0.2 nm, and then aluminum was deposited in a thickness of 150 nm. This Al/LiF functions as an anode. Thus, the organic EL devices were prepared.

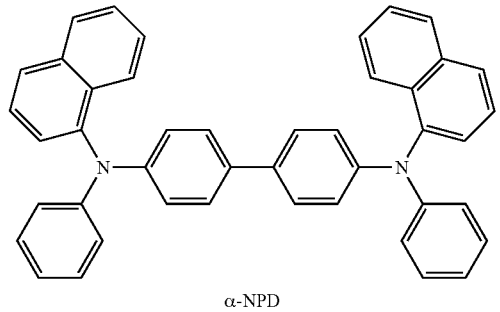

α-NPD

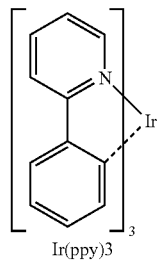

Ir(ppy)3

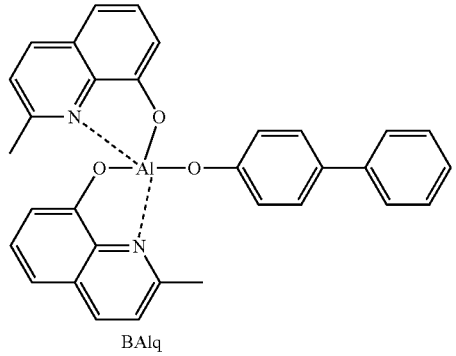

BAlq

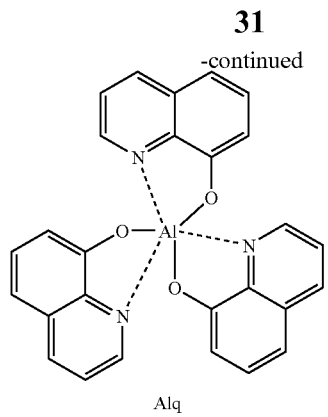

Alq

Voltage was applied to the device 1 and the device 2 thus obtained to carry out a light emitting test, and even green luminescence was obtained in either device.

The device 1 and the device 2 were subjected to constant electric current driving at an initial luminance of 1500 nit to measure a change in the luminance versus driving time, and the result thereof is shown in FIG. 1. As shown in the same drawing, a relative time ratio in which the luminance decayed to 750 nit was about 1:7 of device 1:device 2 (=70 hours:467 hours), and a life of the organic EL device prepared in Example 1 in which the refined [Host 1] having a bromine mass concentration of 17 ppm was used was long to a large extent.

Figure 2:
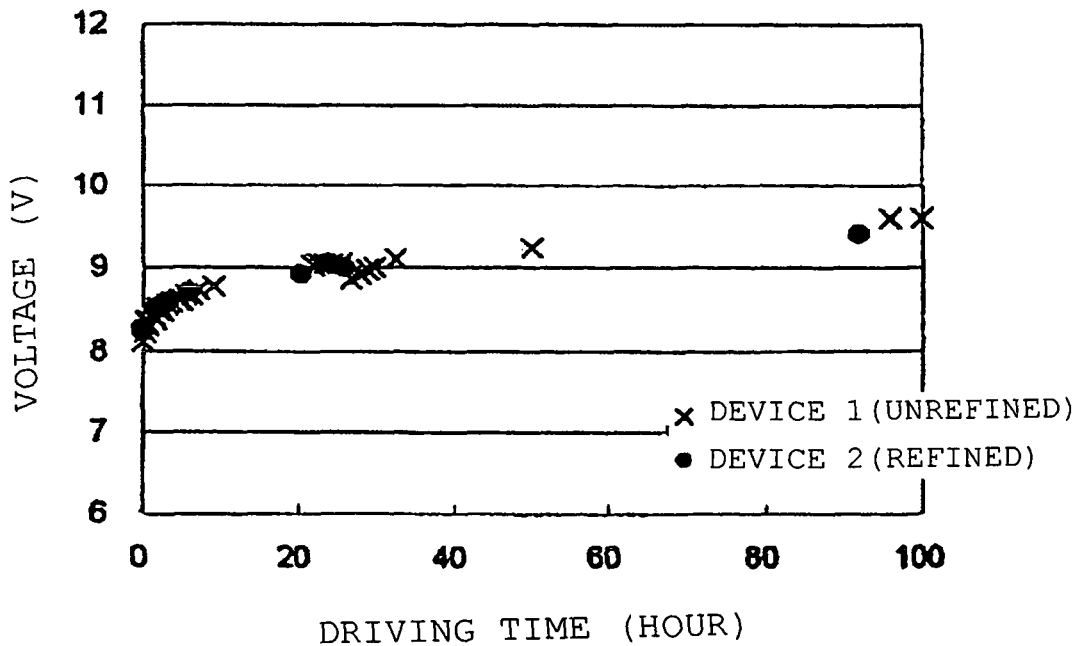
FIG. 2 is a drawing showing a change in a voltage versus a driving time when driving the organic electroluminescent devices prepared in Example 1 and Comparative Example 1.

The device 1 and the device 2 were measured for a rise in voltage after driven for 95 hours to find that it was 1.51 V (device 1) and 1.15 V (device 2), and the organic EL device prepared in Example 1 was lower in a rise in voltage. The result thereof is shown in FIG. 2.

Ir(ppy)$_3$ added to the same light-emitting layer was analyzed as well for bromine and iodine by ICP-MS and chlorine by a coulometric titration method in the same manner as in the [Host 1] to find that the mass concentrations were 5 ppm, 5 ppm and 12 ppm in order respectively. Further, α-NPD and BAlq were analyzed as well for bromine and iodine by ICP-MS and chlorine by the coulometric titration method in the same manner as in the [Host 1] to find that the mass concentrations of bromine were 2 ppm and 3 ppm in order and those of iodine were 2 ppm in both cases and that the mass concentrations of chlorine were 3 ppm and 5 ppm in order.

Example 2 and the Comparative Example 2

A luminescent material 2 (hereinafter referred to as the [Host 2]) was synthesized according to a synthetic scheme shown below:

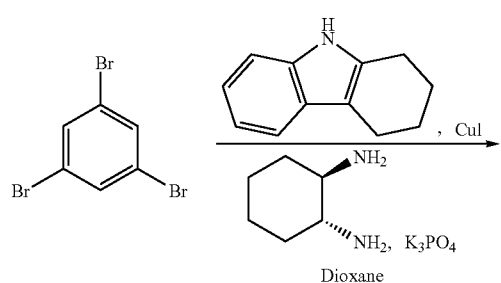

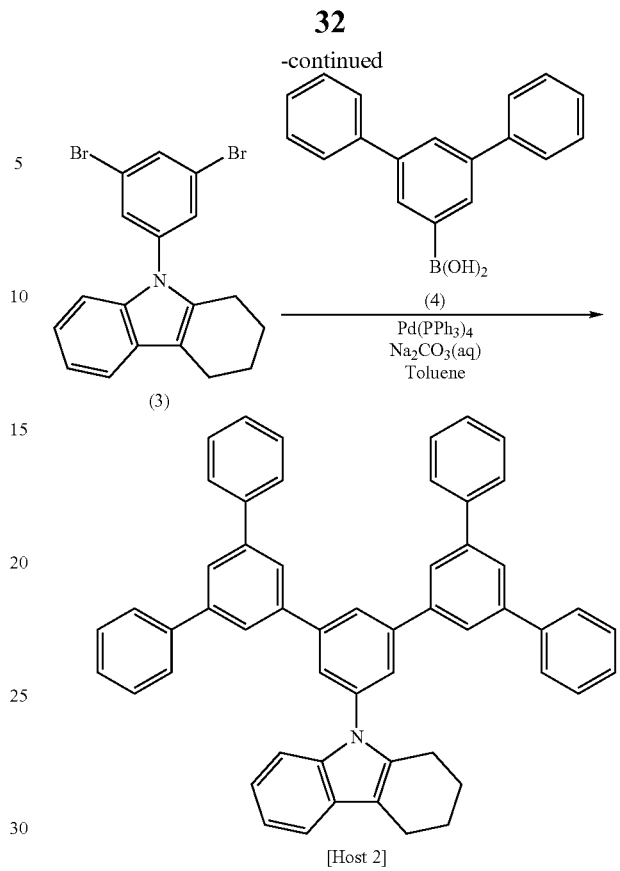

[Host 2]

The compound [Host 2] was synthesized in the following manner.

Synthesis of Synthetic Intermediate (3)

Suspended in 50 ml of 1,4-dioxane were 5.0 g (16 mmol) of 1,3,5-tribromobenzene, 5.3 g (31 mmol) of 1,2,3,4-tetrahydrocarbazole, 0.3 g (0.4 mmol) of copper iodide and 13.8 g (65 mmol) of potassium phosphate, and 1.9 ml (16 mmol) of trans-1,2-cyclohexanediamine was added thereto. The mixture was heated and refluxed for 26 hours under argon atmosphere. The reaction solution was cooled down to room temperature, and methylene chloride and water were added thereto to separate the solution into two layers. Then, the organic layer separated was washed with water and dried on anhydrous sodium sulfate. After distilling the organic solvent off under reduced pressure, the residue was refined by silica gel chromatography to obtain 1.4 g (yield: 22%) of a synthetic intermediate (3).

Synthesis of Synthetic Intermediate (4)

Bromo-3,5-diphenylbenzene 10.0 g (32 mmol) was dissolved in 50 ml of toluene and 50 ml of ether, and 27 ml (42 mmol) of a normal butyllithium hexane solution (1.6M) was added thereto at −16 to −42° C. under argon atmosphere and stirred at −42 to 0° C. for one hour. Next, the reaction solution was cooled down to −70° C., and a solution prepared by diluting 22 ml (97 mmol) of isopropyl borate with 25 ml of ether was dropwise added thereto. The solution was stirred at −70° C. for one hour, and then it was heated up to room temperature and stirred for 6 hours. Further, 70 ml of 5% hydrochloric acid was dropwise added to the reaction solution and then stirred at room temperature for 45 minutes. The reaction solution was separated into two layers, and then the organic layer separated was washed with saturated brine and dried on anhydrous sodium sulfate. After the organic solvent was distilled off to one fifth under reduced pressure, 10 ml of normal hexane was added thereto, and crystal deposited was filtered and washed in order with a toluene-normal hexane mixed solvent and normal hexane to obtain 7.0 g (yield: 78%) of a synthetic intermediate (4).

Synthesis of Compound [Host 2] Suspended in 21 ml of 1,2-dioxane were 1.4 g (3.5 mmol) of the intermediate (3), 1.9 g (7.0 mmol) of the synthetic intermediate (4) and 0.12 g (0.10 mmol) of tetrakis(triphenylphosphine)palladium, and a solution prepared by dissolving 2.2 g (21 mmol) of sodium carbonate in 11 ml of water was added thereto and refluxed for 9 hours by heating. The reaction solution was cooled down to room temperature, and then crystal deposited was filtered and washed in order with water, methanol and ethyl acetate to obtain 2.2 g (yield: 88%) of the crystal. It was confirmed by 90 MHz $^1$H—NMR and FD-MS that the crystal thus obtained was the objective substance [Host 2]. The measured result of FD-MS is shown below.

FD-MS: calculated for $C_{54}H_{41}N$=703, found, m/z=703 (M$^+$, 100)

This unrefined [Host 2] was analyzed by high performance liquid chromatography, NMR and mass spectrometry to analyze the structure of impurities, and as a result thereof, a halide (B) shown below which was a reaction intermediate of the [Host 2] was detected as an impurity.

This impurity was separated and refined and analyzed by means of 90 MHz $^1$H—NMR and FD-MS to result in identifying that the halide (B) had the following structure:

$^1$H—NMR (90 MHz, CDCl$_3$): 7.2 to 8.8 (m, 22H) FD-MS: calculated for $C_{30}H_{28}NBr$=553, found, m/z=553, 555

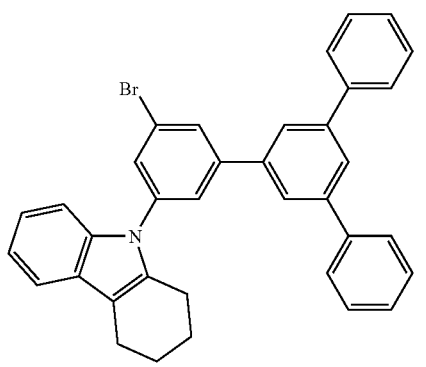

(B)

The unrefined [Host 2] was analyzed for bromine and iodine by ICP-MS and chlorine by the coulometric titration method in the same manner as in the [Host 1] to find that the mass concentrations were 420 ppm, 50 ppm and 28 ppm in order respectively.

Next, this unrefined [Host 2] was sublimated and refined on the conditions of a boat temperature of 340° C. and 1 Pa for the purpose of separating impurities to obtain pale yellow powder. Hereinafter, this is referred to as the refined [Host 2]. This refined [Host 2] was analyzed by high performance liquid chromatography to result in finding that the halide (B) was not detected. Further, the refined [Host 2] was analyzed for bromine and iodine by ICP-MS and chlorine by the coulometric titration method in the same manner as in the [Host 1] to find that the mass concentrations were 14 ppm, 3 ppm and 3 ppm in order respectively. Further, Flrpic added to the same light-emitting layer was analyzed for bromine and iodine by ICP-MS and chlorine by the coulometric titration method in the same manner as in the [Host 1] to find that the mass concentrations were 3 ppm, 3 ppm and 18 ppm in order respectively.

Next, the unrefined [Host 2] and the refined [Host 2] were used as materials for a light-emitting layer to prepare two kinds of organic EL devices having the following structures, wherein the device using the unrefined [Host 2] is referred to as a device 3 (Comparative Example 2), and the device using the refined [Host 2] is referred to as a device 4 (Example 2).

Device 3 (Comparative Example 2): ITO/CuPC/TPAC/ unrefined [Host 2] and Flrpic/Alq/LiF/Al Device 4 (Example 2): ITO/CuPC/TPAC/refined [Host 2] and Flrpic/Alq/LiF/Al The organic EL devices were prepared in the following manner.

A glass substrate of 25 mm×75 mm×0.7 mm thickness quipped with a transparent electrode was subjected to ultrasonic cleaning in isopropyl alcohol for 5 minutes and then subjected to UV ozone cleaning for 30 minutes. After cleaning, the glass substrate quipped with a transparent electrode was mounted in a substrate holder of a vacuum deposition apparatus, and the following copper phthalocyanine film (abbreviated as the "CuPc film") having a film thickness of 10 nm was formed on a face of a side in which the transparent electrode was formed so that the transparent electrode described above was covered. This CuPc film functions as a hole injecting layer. Following the formation of the CuPc film, the following 1,1'-bis[4-N,N-di(paratolyl)aminophenyl]cyclohexane film (abbreviated as the "TPAC film") having a film thickness of 30 nm was formed on this film. This TPAC film functions as a hole transporting layer. Further, the [Host 2] was deposited as a host material on the TPAC film to form a light-emitting layer having a film thickness of 30 nm. Simultaneously, Ir bis[(4,6-difluorophenyl)-pyridinate-N, C$^{2'}$] picolinate (hereinafter abbreviated as "Flrpic") shown below was added as a phosphorescent Ir metal complex. A concentration of Flrpic in the light-emitting layer was set to 7 mass %. This film functions as a light-emitting layer. An Alq film having a film thickness of 30 nm was formed on the above film. This Alq film functions as an electron injecting layer. Thereafter, LiF which is alkali metal halide was deposited in a thickness of 0.2 nm, and then aluminum was deposited in a thickness of 150 nm. This Al/LiF functions as a cathode. Thus, the organic EL devices were prepared.

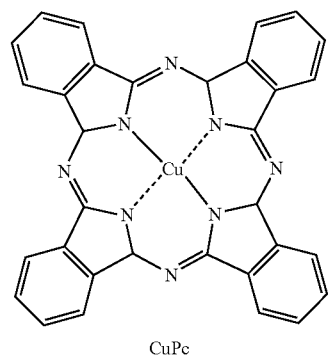

CuPc

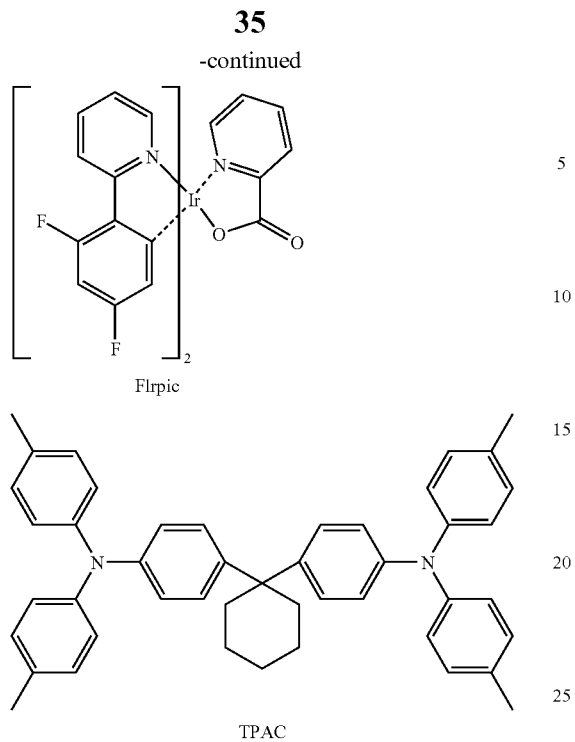

Flrpic

TPAC

Voltage was applied to the device 3 and the device 4 thus obtained to carry out a light emitting test, and even turquoise luminescence was obtained in either device.

Figure 3:
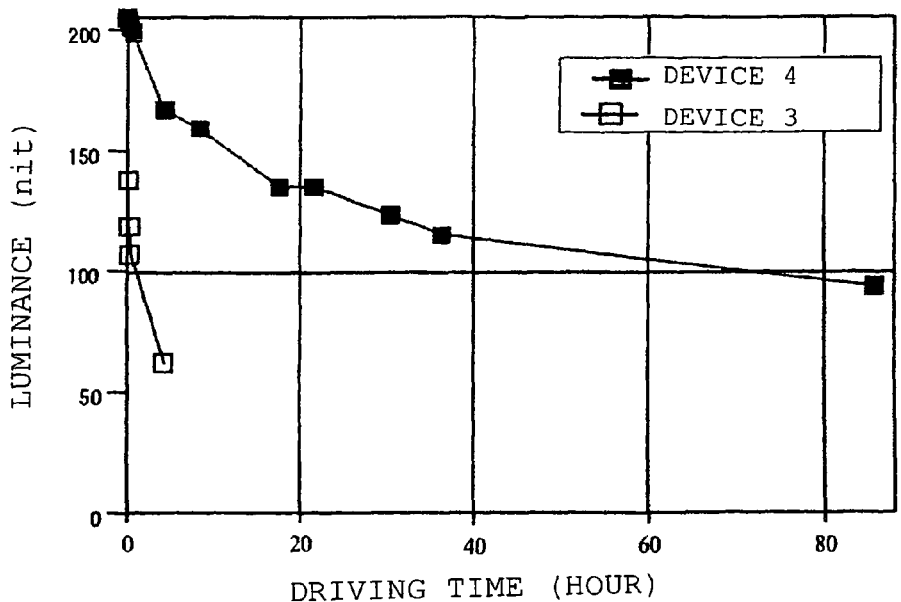
FIG. 3 is a drawing showing a change in an emission luminance versus a driving time when driving the organic electroluminescent devices prepared in Example 2 and Comparative Example 2 at a low voltage.

The device 3 and the device 4 obtained were subjected respectively to constant electric current driving at an initial luminance of 200 nit to measure a change in the luminance versus driving time, and the result thereof is shown in FIG. 3. As shown in the same drawing, a relative time ratio in which the luminance decayed by half to 100 nit was about 1:100 of device 3:device 4 (=0.7 hour:71 hours), and a life of the organic EL device prepared in Example 2 in which the refined [Host 2] having a bromine mass concentration of 14 ppm was used was long to a large extent. Further, TPAC and Flrpic were analyzed for bromine and iodine by ICP-MS and chlorine by the coulometric titration method in the same manner as in the [Host 1] to find that a mass concentration of bromine was 3 ppm in either device and a mass concentration of iodine was 2 ppm in either device and that the mass concentrations of chlorine were 3 ppm and 12 ppm in order.

Examples 3 to 5 and Comparative Example 3

A luminescent material 3 (hereinafter referred to as the [Host 3]) was synthesized according to a synthetic scheme shown below:

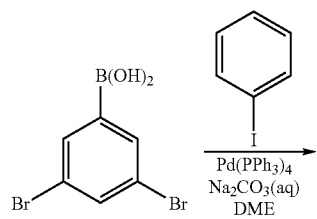

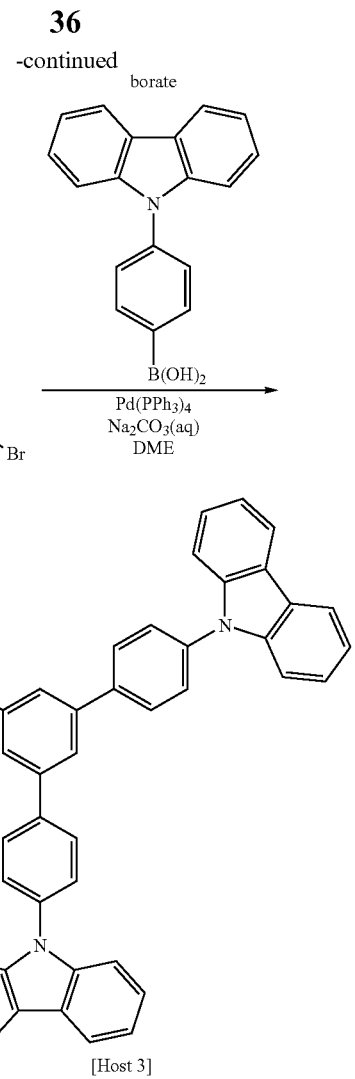

[Host 3]

The compound [Host 3] was synthesized in the following manner.

Synthesis of Synthetic Intermediate (5)

Suspended in 32 ml of 1,2-dimethoxymethane were 3.0 g (11 mmol) of 3,5-dibromophenyl borate, 2.2 g (11 mmol) of iodobenzene and 0.25 g (0.21 mmol) of tetrakis(triphenylphosphine)palladium, and a solution prepared by dissolving 3.4 g (32 mmol) of sodium carbonate in 16 ml of water was added thereto and refluxed for 9 hours under argon atmosphere by heating. The reaction solution was separated into two layers, and then the organic layer separated was washed in order with 5% sodium carbonate, 5% hydrochloric acid, water and saturated brine and dried on anhydrous sodium sulfate. After the organic solvent was distilled off under reduced pressure, the residue was refined by silica gel chromatography (only hexane) to obtain 2.5 g (yield: 75%) of 3,5-dibromobiphenyl (5).

Synthesis of Compound [Host 3]

Suspended in 400 ml of 1,2-dimethoxyethane were 20 g (64 mmol) of the intermediate (5), 37 g (130 mmol) of boronic acid described above and 2.2 g (1.9 mmol) of tetrakis(triphenylphosphine)palladium, and a solution prepared by dissolving 41 g (380 mmol) of sodium carbonate in 200 ml of water was added thereto and refluxed for 18 hours under argon atmosphere by heating. The reaction solution was cooled down to room temperature, and then crystal deposited was filtered and washed in order twice with water, twice with methanol and twice with ethyl acetate to obtain crude crystal. The crystal thus obtained was dissolved in 1000 ml of methylene chloride, and the solution was washed with water and filtered under reduced pressure by means of a glass filter on which silica gel and sodium sulfate were put. After distilling the organic solvent off under reduced pressure, 350 ml of ethyl acetate was added thereto, and crystal deposited was filtered and washed twice with 200 ml of ethyl acetate to obtain 44 g (yield: 92%) of crystal. It was sublimated under reduced pressure and refined to obtain 34 g (yield: 77%) of refined crystal. It was confirmed by 90 MHz $^1$H—NMR and FD-MS that the crystal thus obtained was the objective substance [Host 3]. The measured result of FD-MS is shown below.

FD-MS: calculated for $C_{48}H_{32}N_2$=636, found, m/z=636

This unrefined [Host 3] was analyzed by high performance liquid chromatography, NMR and mass spectrometry to analyze the structure of impurities, and as a result thereof, a halide (C) shown below which was a reaction intermediate of the [Host 3] was detected as an impurity.

This impurity was separated and refined and analyzed by means of 90 MHz $^1$H—NMR and FD-MS to result in identifying that the halide (C) had the following structure:

$^1$H—NMR (90 MHz, CDCl$_3$): 7.2 to 8.8 (m, 20H) FD-MS: calculated for $C_{30}H_{20}NBr$=473, found, m/z=473, 475

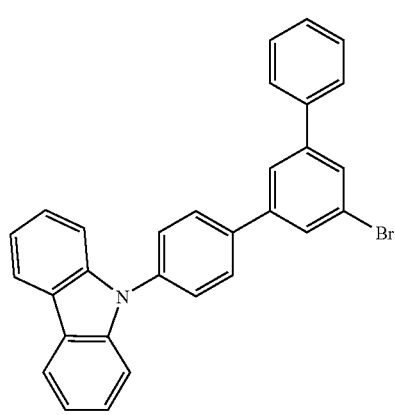

(C)

The unrefined [Host 3] was analyzed for bromine and iodine by ICP-MS and chlorine by the coulometric titration method in the same manner as in the [Host 1] to find that the mass concentrations were 390 ppm, 10 ppm and 10 ppm in order respectively.

Next, the whole amount 34 g of the unrefined [Host 3] was sublimated and refined by means of a sublimation refining apparatus in which a temperature difference was controlled. In respect to temperature control, a heating part was set to 345° C., and the temperature was controlled so that the temperature was reduced as apart from the heating part and was 260° C. in a place which was most apart from the heating part. The vacuum achievement degree was 1.1×10$^{-3}$ Pa. The sublimated and refined [Host 3] was divided into three samples according to the coagulated places. The places closer to the heating part were labelled with S1, S2 and S3, and 8.8 g, 17.4 g and 4.8 g were recovered in order from S1 (yield: 91%). Next, the respective samples were analyzed for bromine and iodine by ICP-MS and chlorine by the coulometric titration method in the same manner as in the [Host 1] to find that the bromine mass concentrations were 24 ppm, 16 ppm and 13 ppm in order of S1, S2 and S3. The iodine mass concentrations were 5 ppm, 4 ppm and 4 ppm in order of S1, S2 and S3, and the chlorine mass concentrations were 4 ppm, 5 ppm and 3 ppm in order of S1, S2 and S3.

Next, the unrefined [Host 3] and the refined [Host 3] (S1, S2 and S3) were used as materials for a light-emitting layer to prepare four kinds of organic EL devices having the following structures, wherein the device using the unrefined [Host 3] is referred to as a device 8 (Comparative Example 3), and the devices using the refined [Host 3] (S1, S2 and S3) are referred to as a device 5 (Example 3), a device 6 (Example 4) and a device 7 (Example 5). The organic EL devices were prepared in the same manner, except that in Example 1 and Comparative Example 1, the unrefined [Host 3] and the refined [Host 3] (S1, S2 and S3) each described above were used respectively in place of the [Host 1].

Device 5 (Example 3): ITO/α-NPD refined [Host 3] (S1) and Ir(ppy)3/BAlq/Alq/LiF/Al Device 6 (Example 4): ITO/α-NPD/refined [Host 3] (S2) and Ir (ppy) $_3$/BAlq/Alq/LiF/Al Device 7 (Example 5): ITO/α-NPD/refined [Host 3] (S3) and Ir(ppy)$_3$/BAlq/Alq/LiF/Al Device 8 (Comparative Example 3): ITO/α-NPD/unrefined [Host 3] and Ir(ppy)$_3$/BAlq/Alq/LiF/Al Voltage was applied to the devices 5 to 8 thus obtained to carry out a light emitting test, and even green luminescence was obtained in all devices.

Figure 4:
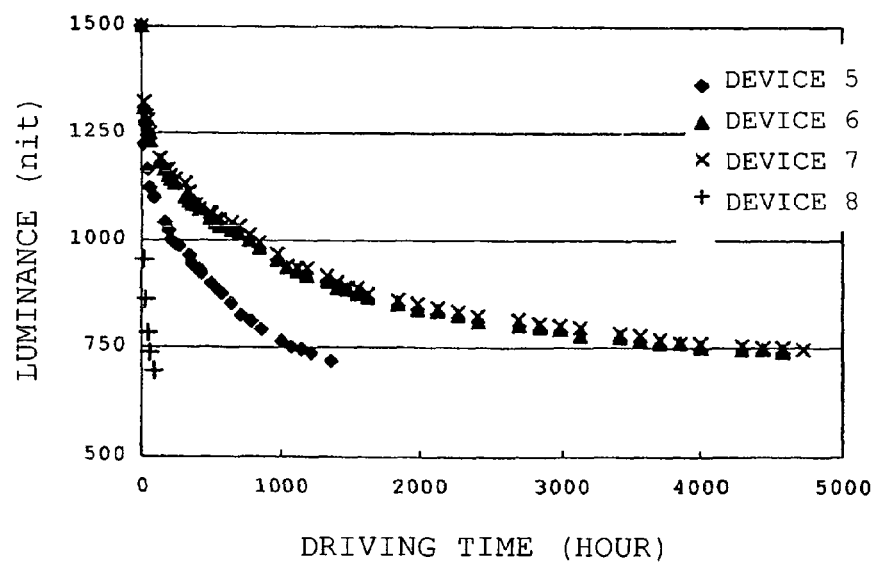
FIG. 4 is a drawing showing a change in an emission luminance versus a driving time when driving the organic electroluminescent devices prepared in Examples 3 to 5 and Comparative Example 3 at a low voltage.

The devices 5 to 8 obtained were subjected to constant electric current driving at an initial luminance of 1500 nit to measure a change in the luminance versus driving time, and the result thereof is shown in FIG. 4. As shown in the same drawing, a relative time ratio in which the luminance decayed by half to 750 nit was about 1:4:4:0.1 of device 5 device 6:device 7:device 8 (=1083 hours:3988 hours:4623 hours:57 hours), and the lives of the organic EL devices prepared in Examples 3 to 5 in which the refined [Host 3] (S1, S2 and S3) was used were longer to a large extent than that of the organic EL device prepared in Comparative Example 3 in which the unrefined [Host 3] was used.

Figure 5:
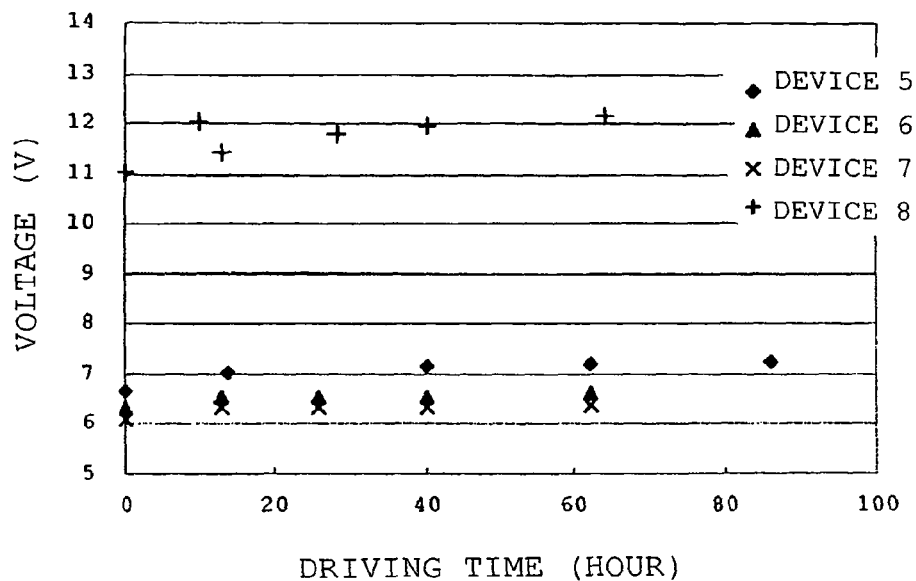
FIG. 5 is a drawing showing a change in a voltage versus a driving time when driving the organic electroluminescent devices prepared in Examples 3 to 5 and Comparative Example 3.

The devices 5 to 8 were measured for a rise in voltage after driven for 40 hours to find that it was 0.45 V (device 5), 0.21 V (device 6), 0.24 V (device 7) and 0.92 V (device 8), and a large difference was present between the devices having a bromine mass concentration of 20 ppm or less and the device to the contrary. The results thereof are shown in FIG. 5.

Example 6 and Comparative Example 4

The whole amount 6.0 g of a synthesized compound [CBP] shown below was sublimated and refined by means of a sublimation refining apparatus in which a temperature difference was controlled. In respect to temperature control, a heating part was set to 305° C., and the temperature was controlled so that the temperature was reduced as apart from the heating part and was 230° C. in a place which was most apart from the heating part. The vacuum achievement degree was 1.1×10$^{-3}$ Pa. The sublimated and refined [CBP] was divided into three samples according to the coagulated places. The places closer to the heating part were labelled with S4, S5 and S6, and 0.9 g, 3.6 g and 0.5 g were recovered in order from S4 (yield: 83%). Next, the respective samples were analyzed for bromine and iodine by ICP-MS and chlorine by the coulometric titration method in the same manner as in S1 to S3 to find that the bromine mass concentrations were 60 ppm, 25 ppm, 22 ppm and 12 ppm in order of unrefined CBP, S4, S5 and S6. The iodine mass concentrations were 28 ppm, 8 ppm, 5 ppm and 5 ppm in order of unrefined CBP, S4, S5 and S6.

The chlorine mass concentrations were 16 ppm, 4 ppm, 5 ppm and 5 ppm in order of unrefined CBP, S4, S5 and S6.

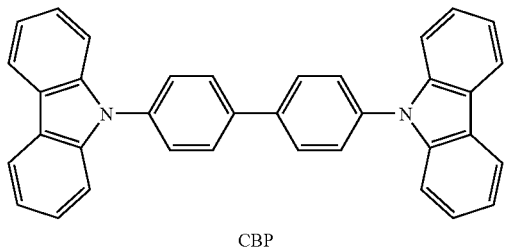 [SMILES: c1ccc2c(c1)c1ccccc1n2-c1ccc(-c2ccc(-n3c4ccccc4c4ccccc43)cc2)cc1 ; "CBP"]

CBP

Next, the unrefined [CBP] and the refined [CBP] (S5) were used as materials for a light-emitting layer to prepare two kinds of organic EL devices having the following structures, wherein the device using the unrefined [CBP] is referred to as a device 9 (Comparative Example 4), and the device using the refined [CBP] is referred to as a device 10 (Example 6). The organic EL devices were prepared in the same manner, except that in Example 1 and Comparative Example 1, the unrefined [CBP] and the refined [CBP] (S5) each described above were used in place of the [Host 1].

Device 9 (Comparative Example 4): ITO/α-NPD/unrefined [CBP] and Ir(ppy)$_3$/BAlq/Alq/LiF/Al Device 10 (Example 6): ITO/α-NPD/refined [CBP] (S5) and Ir(ppy)$_3$/BAlq/Alq/LiF/Al Voltage was applied to the device 9 and the device 10 thus obtained to carry out a light emitting test, and even green luminescence was obtained in either device.

Figure 6:
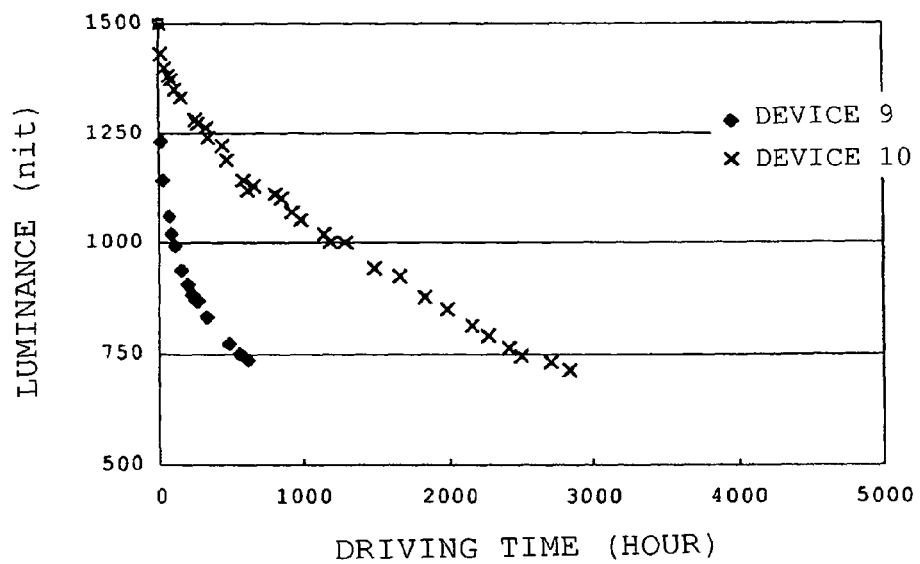
FIG. 6 is a drawing showing a change in an emission luminance versus a driving time when driving the organic electroluminescent devices prepared in Example 6 and Comparative Example 4 at a low voltage.

The device 9 and the device 10 obtained were subjected respectively to constant electric current driving at an initial luminance of 1500 nit to measure a change in the luminance versus driving time, and the result thereof is shown in FIG. 6. As shown in the same drawing, a relative time ratio in which the luminance decayed by half to 750 nit was about 1:5 of device 9:device 10 (=475 hours:2469 hours), and a life of the organic EL device prepared in Example 6 in which the refined [CBP] was used was longer to a large extent than that of the organic EL device prepared in Comparative Example 4 in which the unrefined [CBP] was used.

Figure 7:
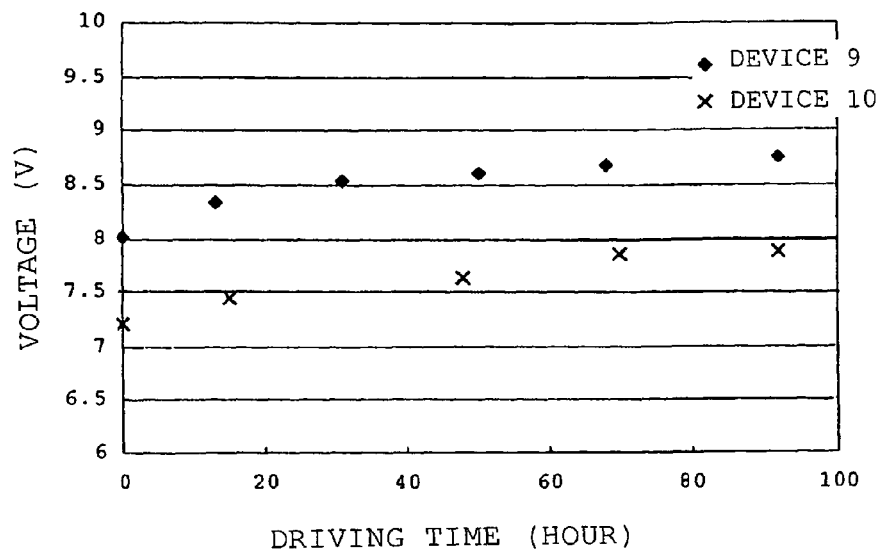
FIG. 7 is a drawing showing a change in a voltage to a driving time when driving the organic electroluminescent devices prepared in Example 6 and Comparative Example 4.

The device 9 and the device 10 were measured for a rise in voltage after driven for 92 hours to find that it was 0.74 V (device 9) and 0.65 V (device 10), and the organic EL device prepared in Example 6 was lower in a rise in voltage. The result thereof is shown in FIG. 7.

Examples 7 and 8 and Comparative Example 5

The refined [Host 3] (S3) used in Example 5 was further refined twice by sublimation, and it was measured for the element mass concentrations of bromine and iodine by ICP-MS and the element mass concentration of chlorine by the coulometric titration method in the same manner. As a result thereof, the mass concentrations were 2 ppm of bromine, 1 ppm of iodine and 1 ppm of chlorine (this refined material is referred to as the refined [Host 3] (S3R)). Ir(ppy)$_3$ used in Example 1 was refined by a silica gel column, then washed with distilled water, dried and then refined twice by sublimation, and it was measured for the element mass concentrations of bromine and iodine by ICP-MS and the element mass concentration of chlorine by the coulometric titration method in the same manner. As a result thereof, the respective halogen element mass concentrations were 1 ppm of bromine, 1 ppm of iodine and 1 ppm of chlorine (this refined material is referred to as refined Ir(ppy)$_3$ A).

Organic EL devices were prepared in the same manner, except that in Example 5, the refined [Host 3] (S3R) was used in place of the refined [Host 3] (S3) and refined Ir(ppy)$_3$ A was used in place of Ir(ppy)$_3$ (device 11 (Example 7)) and that in Example 5, refined Ir(ppy)$_3$ A was used in place of Ir(ppy)$_3$ (device 12 (Example 8)).

Device 11 (Example 7): ITO/α-NPD/unrefined [Host 3] (S3R) and Ir(ppy)$_3$ A/BAlq/Alq/LiF/Al Device 12 (Example 8): ITO/α-NPD/refined [Host 3] (S3) and Ir(ppy)$_3$ A/BAlq/Alq/LiF/Al Next, Ir(ppy)$_3$ used in Example 1 was refined by a silica gel column, then dried and refined once by sublimation, and it was measured for bromine and iodine by ICP-MS and chlorine by the coulometric titration method in the same manner. As a result thereof, the respective halogen element mass concentrations were 2 ppm of bromine, 1 ppm of iodine and 7 ppm of chlorine (this refined material is referred to as refined Ir(ppy)$_3$ B).

An organic EL device was prepared in the same manner, except in Example 5, refined Ir(ppy)$_3$ B was used in place of Ir(ppy)$_3$ (device 13 (Comparative example 5)).

Figure 8:
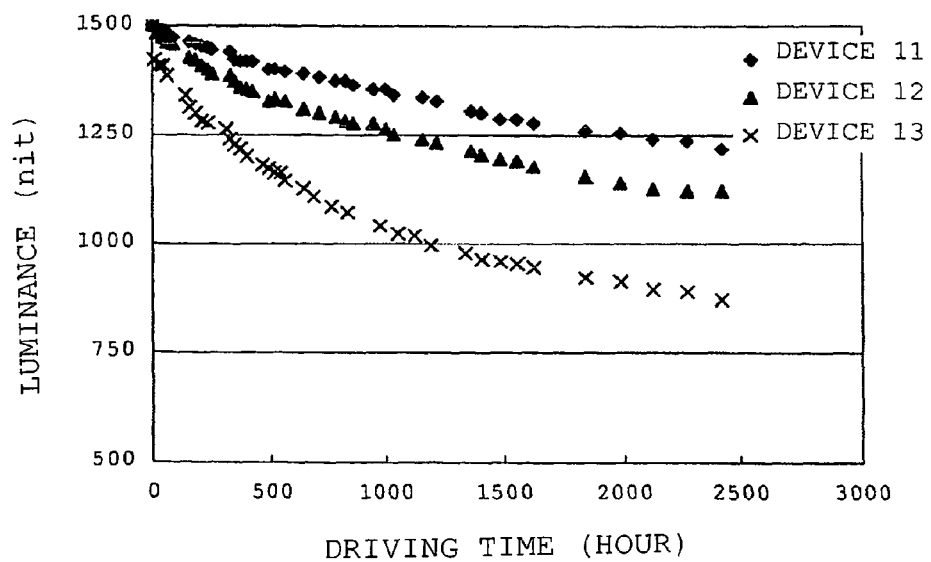
FIG. 8 is a drawing showing a change in an emission luminance versus a driving time when driving the organic electroluminescent devices prepared in Examples 7 and 8 and Comparative Example 5 at a low voltage.

Device 13 (Comparative example 5): ITO/α-NPD/refined [Host 3] (S3) and Ir(ppy)$_3$ B/BAlq/Alq/LiF/Al The devices 11 to 13 obtained were subjected respectively to constant electric current driving at an initial luminance of 1500 nit to measure a change in the luminance versus driving time, and the result thereof is shown in FIG. 8.

As shown in the same drawing, comparison of the device 12 with the device 13 shows that a large difference is apparently observed between the device 12 in which the total of the halogen element mass concentrations of bromine, iodine and chlorine each contained in the phosphorescent organic metal complex is 5 ppm or less and the device 13 to the contrary. To be specific, time of a device life in which the luminance decayed from an initial luminance of 1500 nit and reached 1250 nit was less than 400 hours in the device 13 in which the total of the halogen element mass concentrations of bromine, iodine and chlorine each contained in the phosphorescent organic metal complex (in this case, refined Ir(ppy)$_3$ A and refined Ir(ppy)$_3$ B) exceeded 5 ppm, and in contrast with this, a life of about 1000 hours was observed in the device 12 in which it was 5 ppm or less.

Further, comparison of the device 11 with the device 12 shows that a large difference in a life is observed between the devices in which the total of the halogen element mass concentrations of bromine, iodine and chlorine each contained in the host material and the phosphorescent organic metal complex is 5 ppm or less and the device to the contrary. To be specific, time of a device life in which the luminance decayed from an initial luminance of 1500 nit and reached 1250 nit was about 1000 hours in the device 12 using the refined [Host 3] (S3) in which the total of the halogen element mass concentrations of bromine, iodine and chlorine was 20 ppm, and in contrast with this, a twice rise in a device life of about 2000 hours was observed in the device 11 using the refined [Host 3] (SR3) in which the total of the halogen element mass concentrations of bromine, iodine and chlorine was 5 ppm or less.

Industrial Applicability

As explained above in details, the organic EL device of the present invention is phosphorescent and therefore has a high emission luminance and a high luminous efficiency, and the organic EL device having a high emission luminance and a high luminous efficiency and having a long life is obtained by reducing very much the mass concentrations of halogen elements as impurities contained in a light-emitting layer.

Accordingly, the organic EL device of the present invention is suitably used for electrophotographic photoreceptors, plane luminants such as flat panel displays for wall-hung TV, copying machines, printers, backlights for liquid crystal displays or light sources for gauges, display boards, marker lamps and accessories.

What is claimed is:

1. An organic electroluminescent device in which an organic thin film layer comprising a single layer or plural layers comprising a phosphorescent light-emitting layer is interposed between a cathode and an anode, wherein a halogen element mass concentration of bromine which is contained as an impurity in the host material of the phosphorescent light-emitting layer is 30 ppm or less, wherein the phosphorescent light-emitting layer comprises at least one phosphorescent organic iridium complex and at least one compound selected from the group consisting of an aromatic hydrocarbon compound and an aromatic heterocyclic compound and wherein the aromatic hydrocarbon compound and the aromatic heterocyclic compound have a structure represented by the following Formulae (1) or (2):

Formula (1):

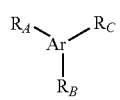
(1)

wherein Ar represents a substituted or non-substituted trivalent aromatic hydrocarbon group having 6 to 18 ring carbon atoms; $R_A$, $R_B$ and $R_C$ each represent independently a substituted or non-substituted aromatic hydrocarbon group having 6 to 18 ring carbon atoms, a substituted or non-substituted aromatic heterocyclic group having 3 to 14 ring carbon atoms; $R_A$, $R_B$ and $R_C$ each may be the same or different;

Formula (2):

$R_A$—Ar'—$R_B$ (2)

wherein Ar' represents a substituted or non-substituted divalent aromatic hydrocarbon group having 6 to 18 ring carbon atoms; $R_A$, and $R_B$ each represent independently a substituted or non-substituted aromatic hydrocarbon group having 6 to 18 ring carbon atoms, a substituted or non-substituted aromatic heterocyclic group having 3 to 14 ring carbon atoms or a substituted, and $R_A$ and $R_B$ each may be the same or different, wherein the host material further comprises a halide comprising a halogen element and having at least one structure represented by the following Formulas (3) to (5):

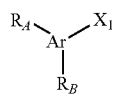
(3)

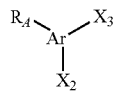
(4)

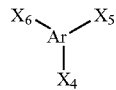
(5)

wherein Ar represents a substituted or non-substituted trivalent aromatic hydrocarbon group having 6 to 18 ring carbon atoms; $R_A$ and $R_B$ each represent independently a substituted or non-substituted aromatic hydrocarbon group having 6 to 18 ring carbon atoms, a substituted or non-substituted aromatic heterocyclic group having 3 to 14 ring carbon atoms; $R_A$, $R_B$ and $R_C$ each may be the same or different;

in Formula (3), $X_1$ represents a halogen atom;

in Formula (4), one of $X_2$ to $X_3$ represents a halogen atom, and the remainder represents a halogen atom or a hydrogen atom;

in Formula (5), at least one of $X_4$ to $X_6$ represents a halogen atom, and the remainder represents a halogen atom or a hydrogen atom; and provided that when $X_2$ to $X_6$ are hydrogen atoms, Ar is reduced in a valency according to the number of the hydrogen atoms; and when two or more of $X_2$ to $X_3$ or $X_4$ to $X_6$ are halogen atoms, they may the same atom.

2. The organic electroluminescent device as described in claim 1, wherein the halogen element mass concentration of bromine contained as an impurity in the host material of the phosphorescent light-emitting layer is 1 ppb to 30 ppm.

3. The organic electroluminescent device as described in claim 1, wherein the aromatic hydrocarbon compound and the aromatic heterocyclic compound each have a structure represented by Formula (1).

4. The organic electroluminescent device as described in claim 1, wherein the aromatic hydrocarbon compound and the aromatic heterocyclic compound each have a structure represented by Formula (2).

5. The organic electroluminescent device as described in claim 1, wherein the total of halogen element mass concentrations of bromine, iodine and chlorine contained as an impurity in the host material of the phosphorescent light-emitting layer is 5 ppm or less.

6. An organic electroluminescent device in which an organic thin film layer comprising a single layer or plural layers comprising a phosphorescent light-emitting layer is interposed between a cathode and an anode, wherein a halogen element mass concentration of bromine which is contained as an im urit in the host material of the phosphorescent light-emitting layer is 30 ppm or less, wherein the phosphorescent light-emitting layer comprises at least one phosphorescent organic iridium complex and at least one compound selected from the group consisting of an aromatic hydrocarbon compound and an aromatic heterocyclic compound and wherein the aromatic hydrocarbon compound and the aromatic heterocyclic compound have a structure represented by the following Formulae (1) or (2):

Formula (1):

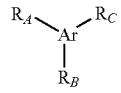
(1)

wherein Ar represents a substituted or non-substituted trivalent aromatic hydrocarbon group having 6 to 18 ring carbon atoms; $R_A$, $R_B$ and $R_C$ each represent independently a substituted or non-substituted aromatic hydrocarbon group having 6 to 18 ring carbon atoms, a substituted or non-substituted aromatic heterocyclic group having 3 to 14 ring carbon atoms; $R_A$, $R_B$ and $R_C$ each may be the same or different;

Formula (2):

$$R_A\text{—}Ar'\text{—}R_B \quad (2)$$

wherein Ar' represents a substituted or non-substituted divalent aromatic hydrocarbon group having 6 to 18 ring carbon atoms; $R_A$ $R_B$ represent independently a substituted or non-substituted aromatic hydrocarbon group having 6 to 18 ring carbon atoms, a substituted or non-substituted aromatic heterocyclic group having 3 to 14 ring carbon atoms or a substituted, and $R_A$ and $R_B$ each may be the same or different, wherein the host material further comprises a halide comprising a halogen element and having a structure represented by the following Formulas (6) and/or (7):

$$R_A\text{—}Ar'\text{—}X_1 \quad (6)$$

$$X_2\text{—}Ar'\text{—}X_3 \quad (7)$$

wherein Ar' represents a substituted or non-substituted divalent aromatic hydrocarbon group having 6 to 18 ring carbon atoms; $R_A$ each represents independently a substituted or non-substituted aromatic hydrocarbon group having 6 to 18 ring carbon atoms, a substituted or non-substituted aromatic heterocyclic group having 3 to 14 ring carbon atoms;

in Formula (6), $X_1$ represents a halogen atom;

in Formula (7), one of $X_2$ to $X_3$ represents a halogen atom, and the remainder represents a halogen atom or a hydrogen atom;

provided that when $X_2$ to $X_3$ are hydrogen atoms, Ar' is reduced in a valency according to the number of the hydrogen atoms; and when two or more of $X_2$ to $X_3$ are halogen atoms, they may the same atom.

7. The organic electroluminescent device as described in claim 3, wherein in Formula (1), Ar is benzenetriyl or terphenylene.

8. The organic electroluminescent device as described in claim 4, wherein in Formula (2), Ar' is phenylene or biphenylene.

9. The organic electroluminescent device as described in claim 3, wherein the phosphorescent light-emitting layer comprises an aromatic hydrocarbon compound having the structure represented by Formula (1).

10. The organic electroluminescent device as described in claim 4, wherein the phosphorescent light-emitting layer comprises an aromatic hydrocarbon compound having the structure represented by Formula (2).

11. The organic electroluminescent device as described in claim 1, wherein the phosphorescent light-emitting layer comprises the halide having at least one structure represented by Formulas (3) to (5).

12. The organic electroluminescent device as described in claim 6, wherein the phosphorescent light-emitting layer comprises the halide having the structure represented by Formulas (6) and/or (7).

13. The organic electroluminescent device as described in claim 1, wherein the halogen element mass concentration is identified by inductively coupled plasma-mass spectrometry (ICP-MS analysis) or a coulometric titration method.

14. The organic electroluminescent device as described in claim 1, wherein a halogen element mass concentration of at least one halide contained in a material constituting a hole transporting layer, an electron transporting layer or a hole blocking layer which is adjacent to the light-emitting layer is 20 ppm or less.

15. The organic electroluminescent device as described in claim 1, wherein in Formula (1) Ar is benzenetriyl or terphenylene and in Formula (2) Ar' is phenylene or biphenylene.

16. The organic electroluminescent device as described in claim 3, wherein the phosphorescent light-emitting layer comprises an aromatic heterocyclic compound having the structure represented by Formula (1).

17. The organic electroluminescent device as described in claim 4, wherein the phosphorescent light-emitting layer comprises an aromatic heterocyclic compound having the structure represented by Formula (2).

* * * * *